United States Patent
Ito et al.

(10) Patent No.: US 7,157,340 B2
(45) Date of Patent: Jan. 2, 2007

(54) METHOD OF FABRICATION OF SEMICONDUCTOR DEVICE

(75) Inventors: Takayuki Ito, Kawasaki (JP); Kyoichi Suguro, Yokohama (JP); Kanna Tomiie, Chigasaki (JP); Kazuya Ouchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/052,861

(22) Filed: Feb. 9, 2005

(65) Prior Publication Data

US 2005/0202656 A1    Sep. 15, 2005

(30) Foreign Application Priority Data

Feb. 9, 2004   (JP)   ............... P2004-032498
Dec. 3, 2004   (JP)   ............... P2004-351583

(51) Int. Cl.
*H01L 21/336* (2006.01)
*H01L 21/331* (2006.01)
*H01L 21/332* (2006.01)

(52) U.S. Cl. ............... 438/301; 438/449; 438/473; 257/E33.041

(58) Field of Classification Search ............... 438/301, 438/449, 473
See application file for complete search history.

(56) References Cited

U.S. PATENT DOCUMENTS

| 6,022,795 | A | * | 2/2000 | Chen et al. | ............... 438/586 |
| 6,423,586 | B1 | * | 7/2002 | Yamazaki et al. | ........... 438/166 |
| 6,440,785 | B1 | * | 8/2002 | Yamazaki et al. | ........... 438/164 |
| 6,767,796 | B1 | | 7/2004 | Tanaka et al. | |
| 6,984,551 | B1 | * | 1/2006 | Yamazaki et al. | ........... 438/164 |
| 2003/0193066 | A1 | | 10/2003 | Ito et al. | |

FOREIGN PATENT DOCUMENTS

| JP | 07-106247   | 4/1995 |
| JP | 2002-118078 | 4/2002 |
| JP | 2003-309097 | 10/2003 |

* cited by examiner

*Primary Examiner*—Michael Lebentritt
*Assistant Examiner*—Elias Ullah
(74) *Attorney, Agent, or Firm*—Finnegan, Henderson, Farabow, Garrett & Dunner, L.L.P.

(57) ABSTRACT

A manufacturing method of a semiconductor device, the method including implanting impurity ions into a silicon layer and irradiating a pulsed light having a pulse width of 100 milliseconds or less and a rise time of 0.3 milliseconds or more onto the silicon layer thereby activating the impurity ions. The rise time is defined as a time interval of a leading edge between an instant at which the pulsed light starts to rise and an instant at which the pulsed light reaches a peak energy.

17 Claims, 28 Drawing Sheets

METHOD OF FABRICATION OF SEMICONDUCTOR DEVICE

CROSS REFERENCE TO RELATED APPLICATIONS

This application is based upon and claims the benefit of priority from prior Japanese Patent Applications P2004-032498 filed on Feb. 9, 2004 and P2004-351583 filed on Dec. 3, 2004, the entire contents thereof are incorporated herein by reference.

BACKGROUND OF THE INVENTION

1. Field of the Invention

The present invention relates to a manufacturing method of a semiconductor device, and more specifically to a heat treatment process for an ion implanted layer or a silicon nitride film layer.

2. Description of the Related Art

Enhancement of the performance of a large-scale integrated circuit (LSI) accompanies enlargement of the degree of the integration. When miniaturized semiconductors are manufactured, each semiconductor layer, dielectric layer, or conductor layer must have desirable properties or must be precisely worked or formed according to the design.

However, since recent semiconductor devices merge a large number of fine elements, they require such a manufacturing method that is designed better and more carefully than before and has high consistency in each process step. From this point of view, the processes for forming source-drain regions and for forming a silicon nitride film ($Si_3N_4$) used for sidewalls of a gate electrode in a MOS transistor have had become problems.

In miniaturization of elements, parasitic resistance and short-channel effect in a MOS transistor, etc. increase as the size of the elements is reduced. Therefore, it becomes important that the source-drain regions are made low in electrical resistance and shallow.

Japanese Patent Application Laid-Open No. 2003-309079 discloses a method in which a source-drain diffusion layer is formed by irradiating light from a xenon (Xe) flash lamp under the condition of irradiation time of 10 milliseconds and irradiation energy of 35 $J/cm^2$, down onto the semiconductor substrate where a gate electrode is formed on a silicon oxide film and further implanted with ions.

However, it is difficult to form shallow impurity regions low in electrical resistance without damaging the wafer, because a process window is small in the conventional annealing process using a flash lamp or a laser.

On the other hand, there are also problems with the formation of a silicon nitride film by the conventional processes when one intends to manufacture the recent semiconductor devices with a shallow impurity region.

When a source-drain diffusion layer is formed in the manufacturing process of miniaturized MOSFET, a silicon nitride film plays an important role as a sidewall insulation film of a gate electrode. Conventionally, the gate sidewall silicon nitride film is usually formed in the shape of a film at a high temperature of approximately 700–780° C.

However, under such a thermal budget, the next-generation semiconductor devices advanced in high integration and miniaturization are difficult to be manufactured, because a diffusion layer once activated is inactivated again to make the electrical resistance of the diffusion layer higher, or impurities re-diffuse to generate the short-channel effect, or the like resulting in degradation of element characteristics.

Also known is a method in which a silicon nitride film (HCD-SiN) is formed by a LPCVD process using hexachlorodisilane ($Si_2Cl_6$). In this method, since a deposition speed is larger than that of a DCS-SiN film, the deposition can be performed at a lower temperature (550° C. or less). Besides, although the DCS-SiN film can be formed in the shape of a film at a low temperature, productivity is extremely poor due to the small deposition speed.

However, there is a problem with a silicon nitride film formed in the shape of a film at a low temperature that etching rate by a solution containing HF is too large because of high impurity (chlorine, hydrogen) concentration and low density.

Japanese Patent Application Laid-Open No. 2002-118078 discloses a method in which quality of a film such as a silicon nitride film is improved by irradiating white light with energy of 10 to 100 $J/cm^2$ for 10 milliseconds or less onto contact and silicide layers connecting a substrate to the wiring, or a silicon nitride film formed as a sidewall of a gate electrode.

However, there still remain a lot of uninvestigated problems such as occurrence of stress generated by the short time irradiation of light, various defects introduced into a recipient body.

To sum up, in manufacturing the recent miniaturized semiconductor device, there have been the requirements contrary to each other between the formation of a source-drain impurity diffused layer and the formation of a silicon nitride film used as a sidewall of a gate electrode, etc. in a MOS structure, and it has been difficult to cope with them.

SUMMARY OF THE INVENTION

A feature of the present invention may inhere in a manufacturing method of a semiconductor device, the method including implanting impurity ions into a silicon layer and irradiating a pulsed light having a pulse width of 100 milliseconds or less and a rise time of 0.3 milliseconds or more onto the silicon layer thereby activating the impurity ions. The rise time is defined as a time interval of a leading edge between an instant at which the pulsed light starts to rise and an instant at which the pulsed light reaches a peak energy.

Another feature of the present invention may inhere in a manufacturing method of a semiconductor device, the method including implanting impurity ions into a silicon layer at a concentration not more than $2 \times 10^{21}$ $ions/cm^3$ and irradiating a pulsed light having a pulse width of 100 milliseconds or less onto the silicon layer, thereby activating the impurity ions.

Still another feature of the present invention may inhere in a manufacturing method of a semiconductor device, the method including delineating a gate electrode on a silicon substrate, depositing a silicon nitride film on the gate electrode at a temperature of 600° C. or less, irradiating a pulsed light onto the silicon nitride film, and anisotropically etching the silicon nitride film after the irradiation so as to leave the silicon nitride film on sidewalls of the gate electrode.

DETAILED DESCRIPTION OF THE EMBODIMENTS

A method of manufacturing the semiconductor device of the present invention will be described with reference to a manufacturing process of a CMOS transistor as an element of a large-scale integrated circuit (LSI). Physical quantities are described based on a light velocity in a vacuum unless otherwise defined.

(First Embodiment)

Figure 1A:
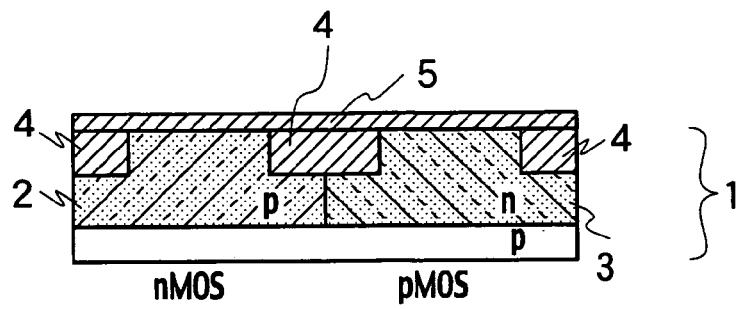
FIG. 1A is a diagram showing a method of manufacturing a semiconductor device of a first embodiment.

First, a well layer 2 of a first conductivity type and a well layer 3 of a second conductivity type are formed on a silicon substrate 1 of a first conductivity type. "A first conductivity type" and "a second conductivity type" are conductivity types different from each other: when the first conductivity type is an n-type, the second conductivity type is a p-type; when the first conductivity type is a p-type, the second conductivity type is an n-type. In the following, a description will be given with the first conductivity type as the p-type and the second conductivity type as the n-type, however the p-type and the n-type can be replaced with each other. Element isolation regions 4 are formed around the periphery of the well layer 2 of the first conductivity type and the periphery of the well layer 3 of the second conductivity type. Then, as shown in FIG. 1A, a silicon oxide ($SiO_2$) film providing a gate insulation film 5 is formed on the surface of the silicon substrate 1.

Figure 1B:
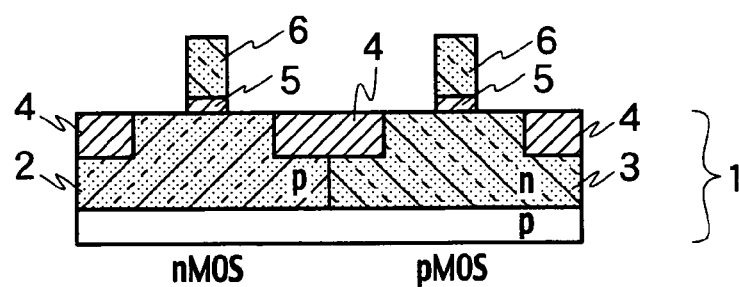
FIGS. 1B to 3C are another diagrams showing the method of manufacturing the semiconductor device of the first embodiment.

Second, a polycrystalline silicon film forms a gate electrode 6 on the gate insulation film 5. The gate electrode 6 is delineated, as shown in FIG. 1B, by selectively etching the polycrystalline film with a reactive ion etching (RIE) process.

Figure 1C:
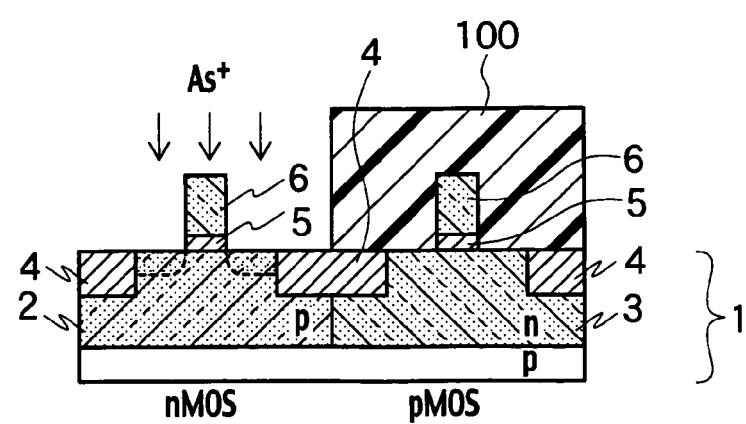

By coating the surface of the well layer 3 of the second conductivity type with a photoresist film 100 and also using the gate electrode 6 for a mask as shown in FIG. 1C, impurity ions of the second conductivity type, for example, arsenic ions (As⁺) are implanted into the surface of the well layer 2 of the first conductivity type. The conditions of the ion implantation such as acceleration energy and a dose amount are adjusted in order to form a shallow extension region 7 of the second conductivity type adjacent to the gate electrode 6 by a subsequent activation anneal.

Figure 2A:
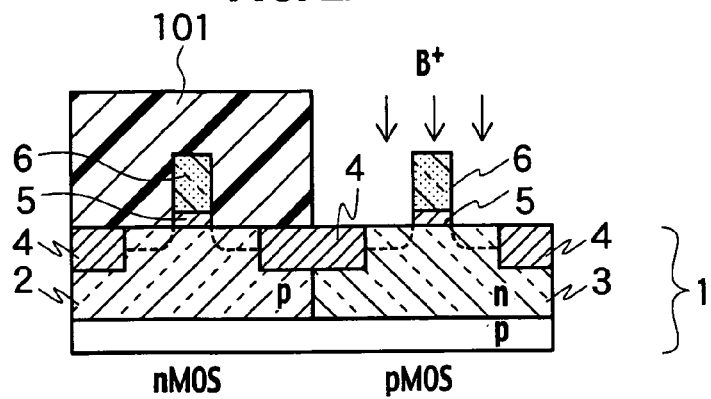

After removing the photoresist film 100, in a similar manner as above, by coating the surface of the well layer 2 of the first conductivity type with a photoresist film 101 and also using the gate electrode 6 for a mask as shown in FIG. 2A, impurity ions of the first conductivity type, for example, boron ions (B⁺) are implanted into the surface of the well layer 3 of the second conductivity type. The conditions of the ion implantation for the impurity ions of the first conductivity type are also adjusted in order to form a shallow extension region 8 of the first conductivity type by a subsequent activation anneal.

Figure 2B:
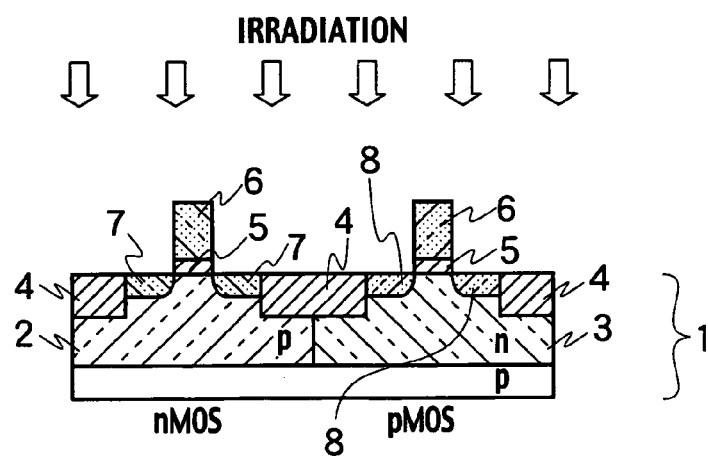

The activation anneal is performed as shown in FIG. 2B. The anneal is preferably performed by maintaining the entire silicon substrate 1 at a given high temperature from start to finish of irradiation by flash lamp light using an additional supplementary heating means such as a hot plate. For example, the silicon substrate 1 is disposed on the hot plate, and the silicon substrate 1 is heated from its front side by the light radiated from a flash lamp light source when the silicon substrate 1 is also heated from its rear side. Preferably, the supplemental heating temperature of the silicon substrate 1 is approximately in a range from 300° C. to 600° C. A supplemental heating temperature that is too low is not preferable because thermal stress generated within the silicon substrate undesirably increases due to the necessity for increased light intensity. On the contrary, a high temperature that is too high is also not preferable, because diffusion of impurity ions is incurred and ion implantation defects tend to remain due to an incomplete progress of solid phase crystal growth.

Although there is little possibility of generation of damage such as slips and dislocations in the substrate 1 because of supplementary heating within the silicon substrate 1, it is preferable to reduce the rate of temperature increase as low as possible, for example 20° C./second or lower, so as not to cause deformation of the silicon substrate 1 during supplementary heating. The silicon substrate may fracture due to irradiating a flash lamp light directed to a bent silicon substrate if the rate of temperature increase is higher than the above value. Further, for the supplementary heating means, another heating means such as a halogen lamp, or an infrared-ray lamp can be employed in place of the hot plate.

Irradiation by the flash lamp is performed typically by a single flash (one pulse) using, for example, a xenon flash lamp. Energy of the light contained in one pulse is determined, depending on the pulse width of the flash lamp light and a temperature of the supplemental heating, and is preferably in a range of 50 J/cm² to 105 J/cm² in the exemplary case where the pulse width (half-width) is 10 milliseconds and the temperature of the supplemental heating is about 450° C. Irradiation energy that is too low is not preferable because insufficient activation of the implanted ions occurs. Too much irradiation energy is also not preferable because of a resulting increased thermal stress generated in the silicon substrate. Further, the pulse width, or a full width at half maximum (FWHM) is preferably around 1 millisecond to 100 milliseconds, more preferably 3 milliseconds to 10 milliseconds. A shorter pulse width than the above is not preferable because of a resulting increase in thermal stress generated in the silicon substrate. Further, a pulse width that is too long is also not preferable because diffusion of the impurity ions occurs.

Figure 2C:
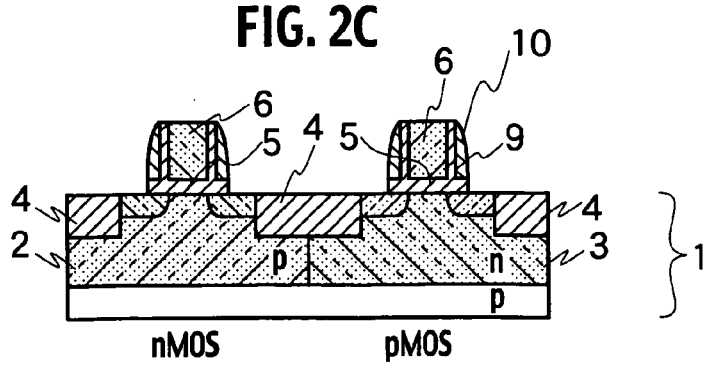

After the preceding anneal (also referred to as "first anneal" in the following), a silicon oxide film 9 and a silicon nitride film 10 are deposited in sequence by a LPCVD process. Then, as shown in FIG. 2C, the silicon nitride film 10 and the silicon oxide film 9 are etched by a RIE process to form sidewall spacers of silicon oxide film 9 and silicon nitride film 10 with a multi-layered structure on the sides of the gate electrode 6.

Figure 3A:
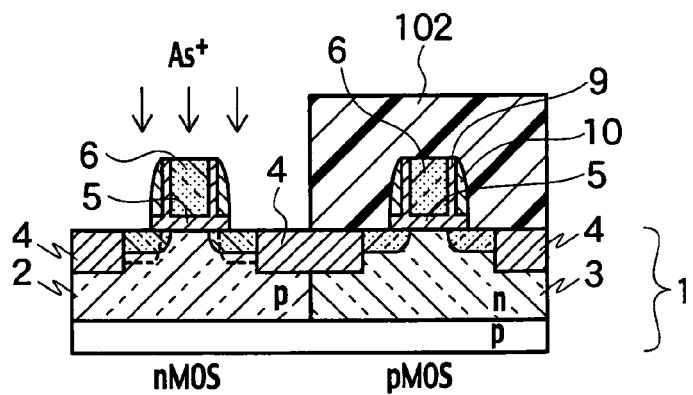
Figure 3B:
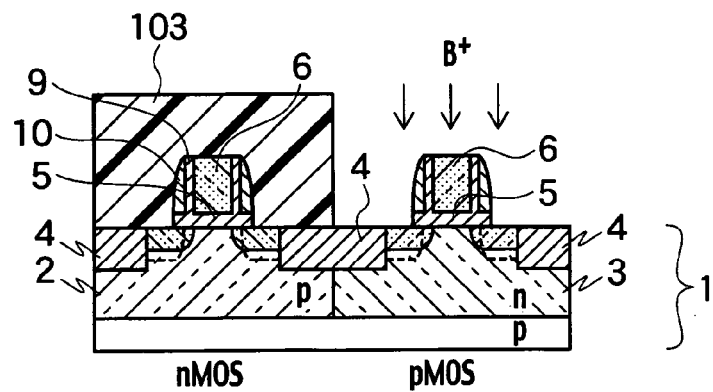

By coating the surface of the well layer 3 of the second conductivity type with a photoresist film 102 and also using the gate electrode 6 and the sidewall spacers for a mask as shown in FIG. 3A, impurity ions of the second conductivity type are implanted into the surface of the well layer 2 of the first conductivity type. In a similar manner, by coating the surface of the well layer 2 of the first conductivity type with a photoresist film 103 and also using the gate electrode 6 and the sidewall spacers of silicon oxide film 9 and silicon nitride film 10 for a mask as shown in FIG. 3B, impurity ions of the first conductivity type are implanted into the surface of the well layer 3 of the second conductivity type. Further, the impurity ions corresponding to each of the above ion implantations are implanted even into the gate electrode 6.

Next, an activation anneal for the implanted ions (referred to as "second anneal" in the following) is performed using a flash lamp as a heat source. It is desirable to use supplementary heating means for heating the semiconductor substrate as in the first anneal, and the heating temperature is preferably set in a range of about 300° C. to 600° C. similar to that of the first anneal treatment. A supplemental heating temperature that is too low is not preferable because insufficient activation of the implanted ions occurs, and a temperature that is too high is also not preferable because diffusion of the impurity ions occurs and ion implantation defects tend to remain in the substrate due to imperfect crystal growth of solid phase silicon materials in the substrate.

Figure 3C:
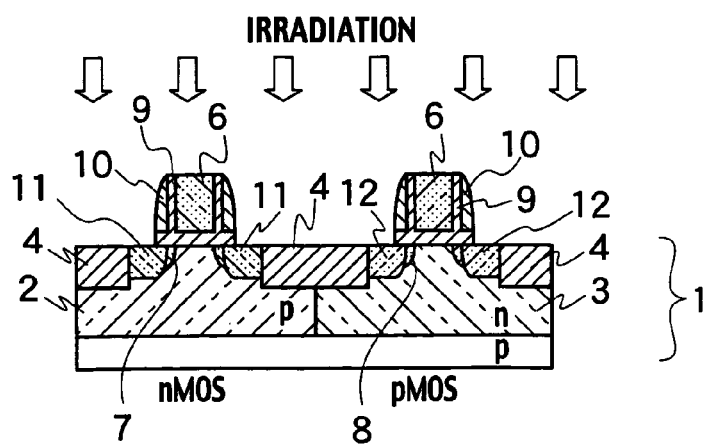

For example, as shown in FIG. 3C, a xenon flash lamp is flashed above the surface of silicon substrate 1 and a light from the xenon flash lamp is irradiated onto the surface of the entire silicon substrate 1.

The irradiated xenon flash lamp light are transmitted through the sidewall spacer of the silicon nitride film 10 and the silicon oxide film 9 and are absorbed into the gate electrode 6, the extension regions 7, 8 within the silicon substrate 1, and source-drain regions 11, 12. The gate electrode 6, the extension regions 7, 8, and the source-drain regions 11, 12 having absorbed the xenon flash lamp light increase in temperature. The temperature of the gate electrode 6, the extension regions 7, 8, and the source-drain regions 11, 12 should exceed 1100° C., and thus the impurities implanted into the gate electrode 6, the extension regions 7, 8 and the source-drain regions 11, 12 are activated. Due to the activation above, the gate electrode 6, the extension regions 7, 8 and the source-drain regions 11, 12 have reduced electrical resistance and the fundamental structure of the semiconductor device of the first embodiment is completed.

Irradiation of the xenon flash lamp light is performed typically by a single flash. Under this circumstance, both a rise time during which the pulsed light reaches its peak energy starting from the leading edge of the waveform and a half-width are important parameters characterizing the waveform of the flash lamp light.

In the flash lamp activation process, the rise time is set to 0.3 milliseconds or more. Rise time shorter than that undesirably increases thermal stress generated within the silicon substrate. A more preferable rise time is 0.3 milliseconds or more and 30 milliseconds or less in order to prevent diffusion of the impurity ions.

Further, the pulse width (FWHM) is preferably 100 milliseconds or less. By this setting, the substrate 1 can never be overheated. More preferable pulse width is from 1 millisecond or more to 100 milliseconds or less; still more preferable pulse width is from 3 milliseconds or more to 10 milliseconds or less. By setting parameters described above, excessive local heating of the surfaces of the gate electrode 6, the extension regions 7, 8, and the source-drain regions 11, 12 can be avoided.

Energy of the irradiated light is dependent also on a pulse width of the light, and the energy is preferably 110 J/cm$^2$ or less for a pulse width of 10 milliseconds. Typically, irradiation is performed in a range of approximately 45 J/cm$^2$ to 110 j/cm$^2$. The substrate 1 cannot be overheated as long as the light with such intensity as described above are employed. By setting the supplemental heating temperature of the substrate to about 600° C. or less, overheating of the silicon substrate 1 can also be avoided.

Figure 7:
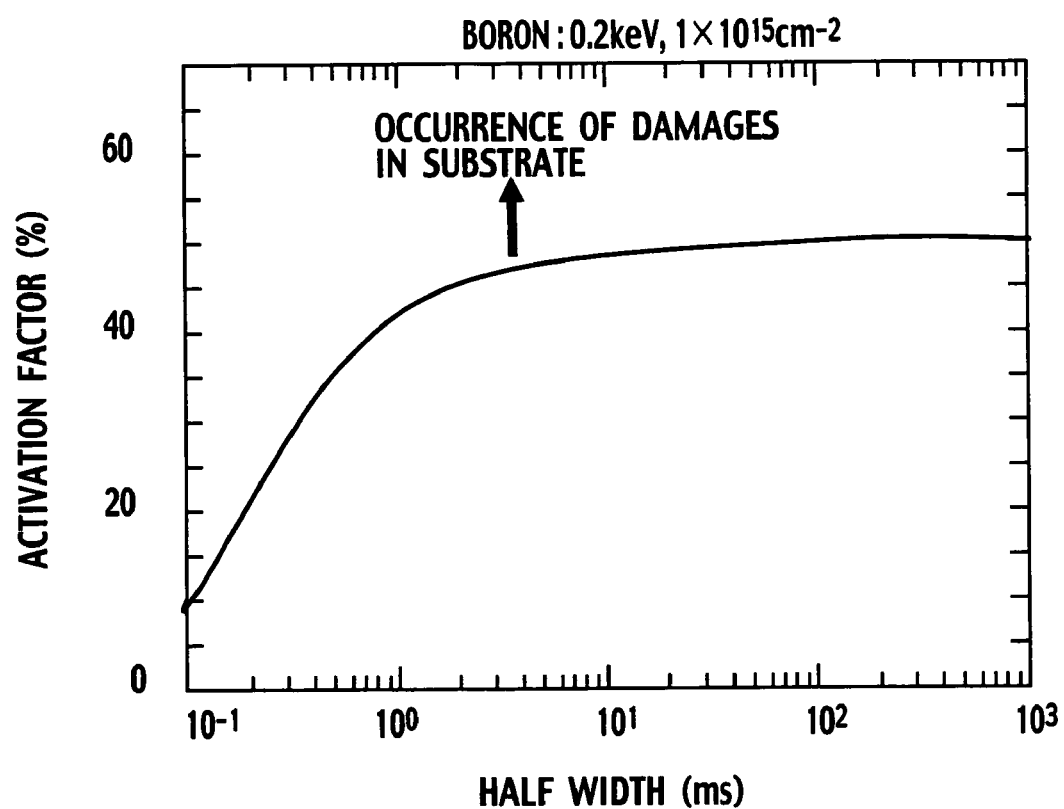
FIG. 7 is a diagram showing an applicable range for impurity activation factors and half-widths of a light source in order to activate a source-drain region after implanting ions.

With regard to the activation process with a flash lamp, as shown in FIG. 7, a process window, through which a shallow extension region with low electrical resistance can be formed without damaging the substrate, can be defined for the pulse width of the flash lamp light. When the pulse width of a light source is too short, slips and dislocations are generated in the silicon substrate before the impurities are sufficiently activated in spite of adjusting the supplementary heating temperature of the substrate and the energy density of the irradiation so as to reduce the electrical resistance of the impurity diffused layer.

When the supplementary heating temperature of the substrate and the energy density of the irradiation are decreased so as to prevent damage in the substrate, sufficient activation cannot be achieved for the impurities implanted into the silicon substrate. However, once the pulse width of the light source is increased, the impurities implanted into silicon substrate can be sufficiently activated without damaging the substrate. It is understood that the process window is enlarged once the pulse width is increased, by an increase in the energy density of the irradiation necessary for activating the impurities as well as an increase in the energy density of the irradiation for generating slips and dislocations in the substrate. The process condition for manufacturing the semiconductor device of Example 1, which will be described later, corresponds to the vicinity of a point 13 in FIG. 8. The conditions are thus considered to be within the process window.

Figure 8:
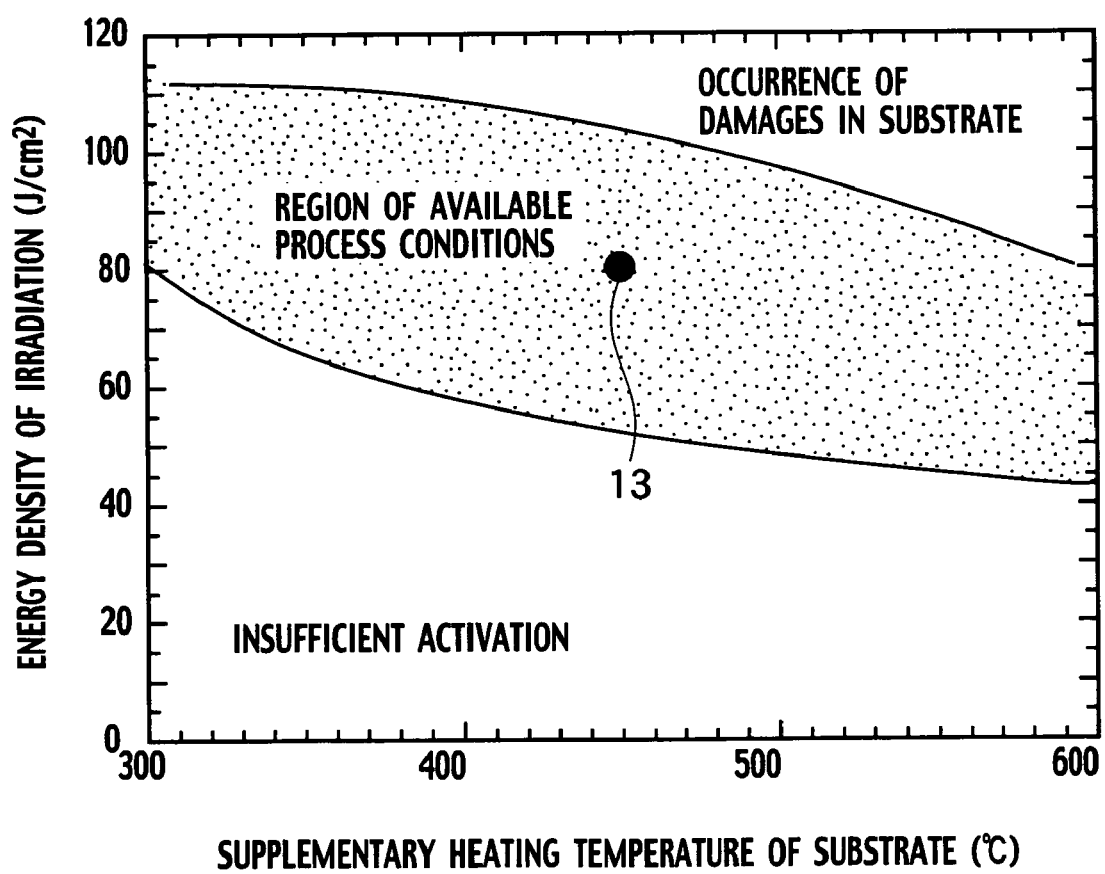
FIG. 8 is a diagram showing an applicable range for supplementary heating temperatures of a substrate and energy densities of irradiation in order to activate a source-drain region after implanting ions.
Figure 9:
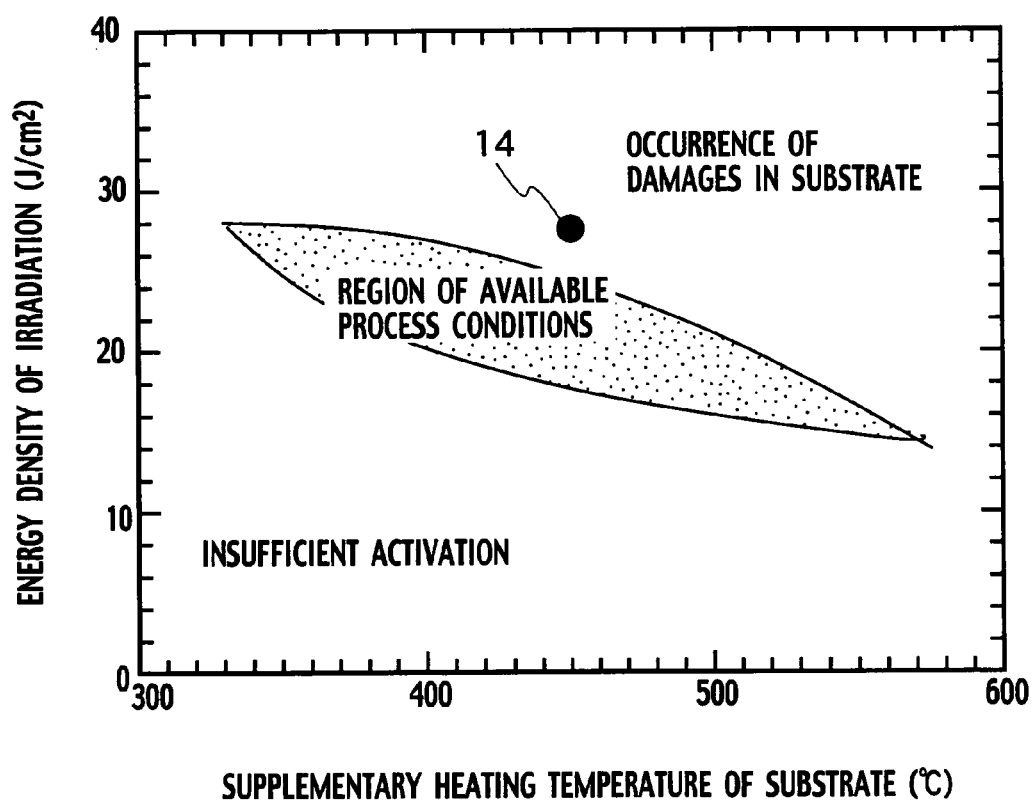
FIG. 9 is a diagram showing an applicable range for supplementary heating temperatures of a substrate and energy densities of irradiation in order to activate a source-drain region after implanting ions when the pulse width is short.

On the other hand, in the Comparative Example described later (the case of a extremely short pulse width), as shown in FIG. 9, the process window is considered to have a smaller window shape than that shown in FIG. 8. For example, the process conditions for manufacturing a semiconductor device according to the Comparative Example correspond to a point 14 and are considered to be outside the process window.

Thus, the shorter a pulse width, the process window for manufacturing a semiconductor device becomes smaller. The reason for this is discussed as follows.

Figure 10:
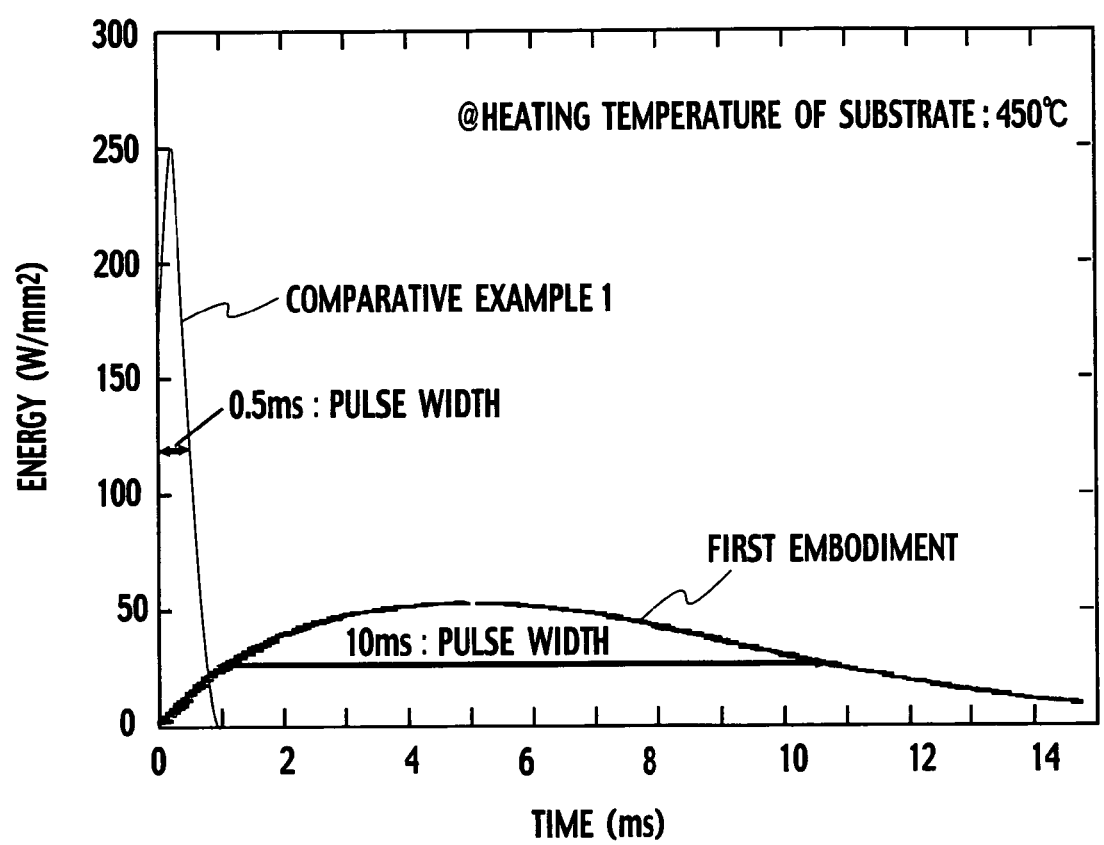
FIG. 10 is a diagram showing waveforms of the light pulses radiated from a flash lamp.
Figure 11:
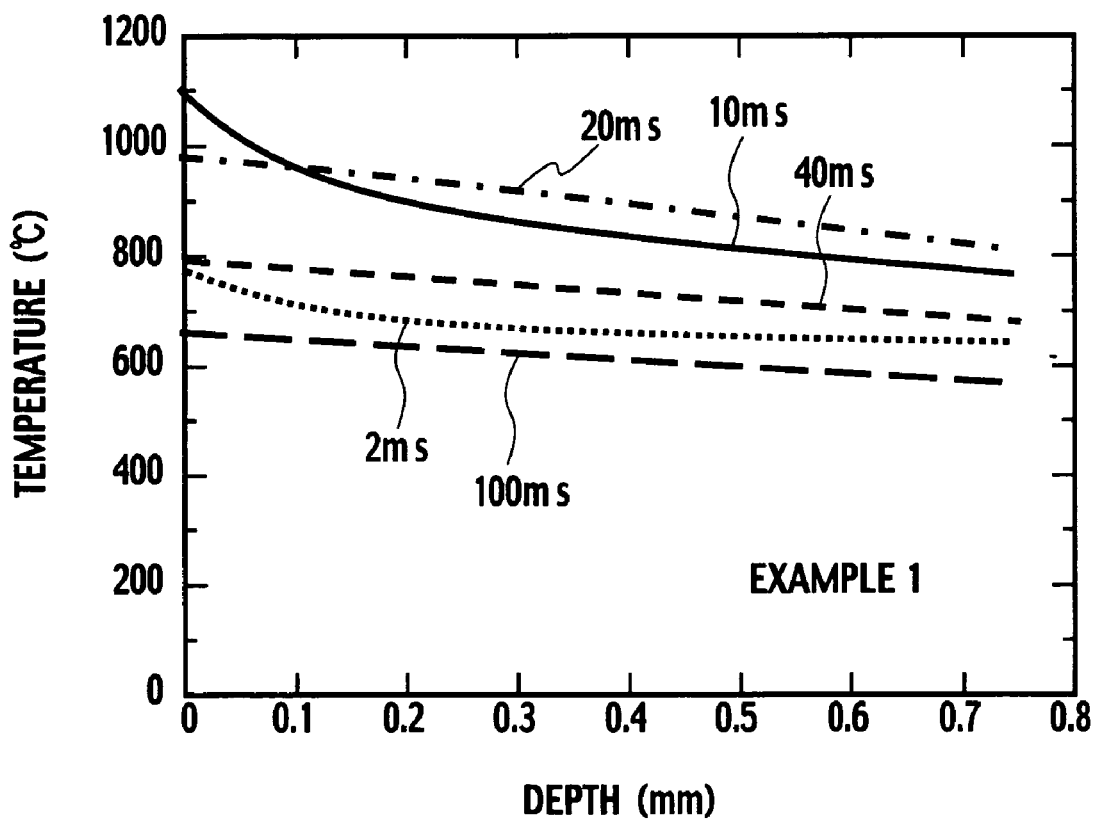
FIG. 11 is a diagram showing a temperature profile in the direction of the depth of a semiconductor substrate during annealing to activate a source-drain region after ion implantation.
Figure 12:
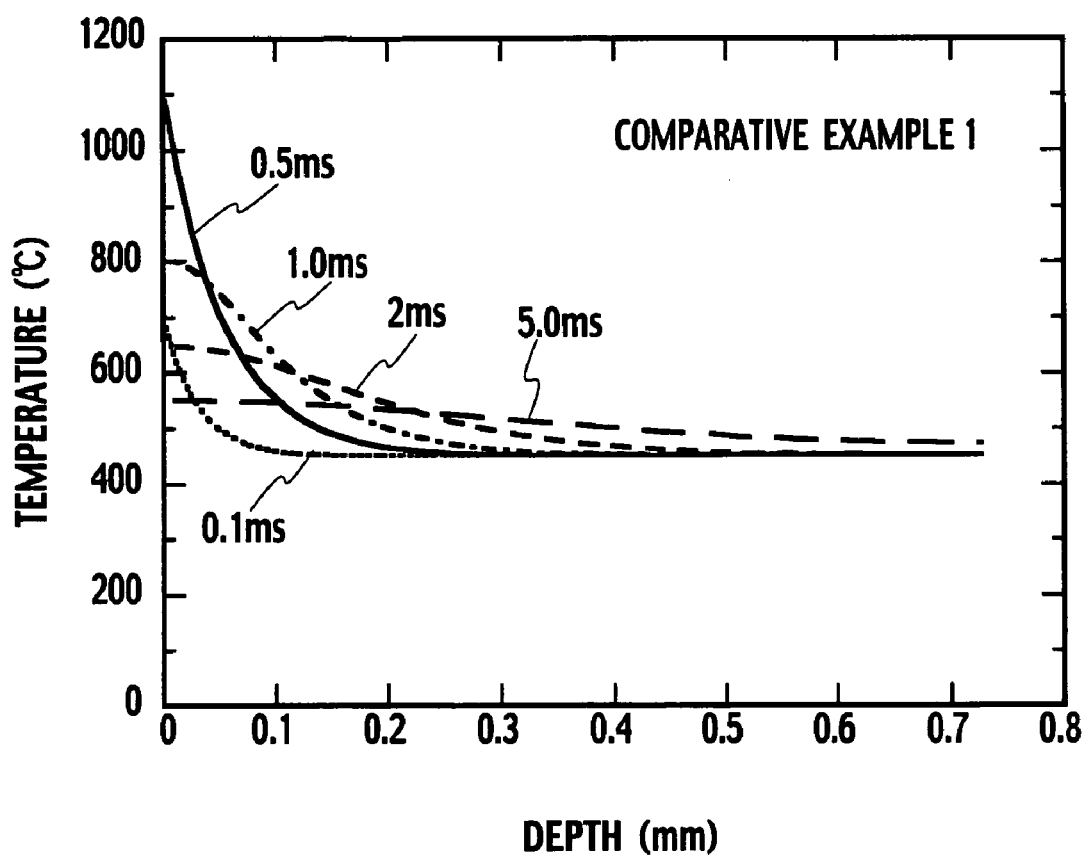
FIG. 12 is a diagram showing a temperature profile in the direction of the depth of a semiconductor substrate during annealing to activate a source-drain region after implanting ions when the pulse width is short.

FIG. 10 shows a waveform of the flash lamp light of the first embodiment and a waveform of a pulse having an extremely short pulse width, as in the case of the Comparative Example 1, respectively. FIG. 11 and FIG. 12 are diagrams showing the results of simulation analysis of the temperature distribution in the thickness direction of a silicon substrate at each time after irradiation by a flash lamp light with a pulse width of 10 milliseconds (in the case of Example 1 described in the following) and 0.5 milliseconds (in the case of Comparative Example 1 described in the following), respectively.

When the pulse width is 10 milliseconds, the front-surface temperature of the silicon substrate increases with time after irradiating from the flash lamp and reaches the maximum of 1100° C. in 10 milliseconds. At this time, the rear-surface temperature of the silicon substrate is dependent on the supplementary heating temperature of the substrate by a hot plate, and the temperature difference generated between the front side and rear side of the silicon substrate is small compared with that of the Comparative Example. When the pulse width is 0.5 milliseconds, the front-surface temperature of the silicon substrate increases quickly after being irradiated by the flash lamp light and reaches the maximum of 1100° C. in 0.5 milliseconds. At this time, a temperature difference of nearly 600° C. is generated between the front side and rear side of the silicon substrate. Compared with the case of the pulse width of 10 milliseconds, it is seen that the front-surface of the silicon substrate is intensively heated when the pulse width is 0.5 milliseconds. Since the irradiation energy necessary for activating the impurities is able to be supplied by the pulse having a smaller pulse-height due to a long pulse width of the light source for the pulse width of 10 milliseconds, steepness of the temperature distribution in the thickness direction of the substrate is less gentle than that in Comparative Example. Consequently, thermal stress generated in the silicon substrate is less when the pulse width is 10 milliseconds, thereby preventing damage to the substrate.

As discussed above, according to the first embodiment, the entire silicon substrate is heated and thermal stress generated in the silicon substrate can be decreased by setting a long pulse width of the flash lamp light source. As a result, the impurity ions implanted into the silicon substrate will be activated at a high activation factor without generating any substrate damage such as slips, and dislocations in the silicon substrate. According to the first embodiment, a process for forming an impurity region with a wide process window can be achieved.

Figure 13:
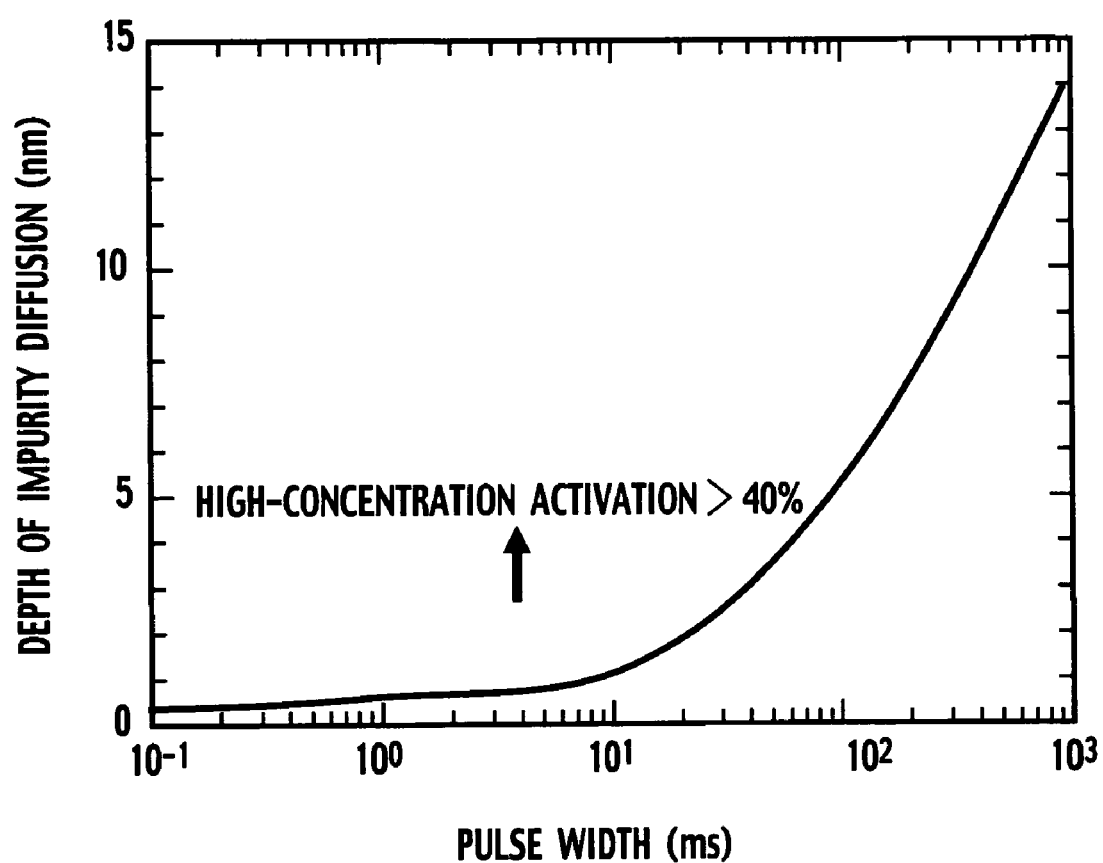
FIG. 13 is a diagram showing an applicable range for diffusion depths of an impurity and half-widths of a light source in order to activate a source-drain region after ion implantion.

On the other hand, the upper limit of a pulse width of a light source is defined by a diffused depth of the impurities. As shown in FIG. 13, since the longer the pulse width of a light source, the deeper the impurities diffuse undesirably, the shorter pulse width will be advantageous to forming a shallow diffused layer. According to the inventors' experience, the impurity ions diffuse into approximately 20 nm for 2 seconds of annealing, approximately 2 nm for 20 milliseconds at 1100° C. when the impurities are, for example, boron ions. In the example described later, the depth immediately after implanting boron ions into a silicon substrate was approximately 10 nm. Thus, when the pulse width of a light source is 100 milliseconds or less, a diffusion length can be limited to approximately 5 nm or less, and it can be assumed that a shallow diffused layer with a junction less than or equal to 20 nm can be formed.

Figure 14:
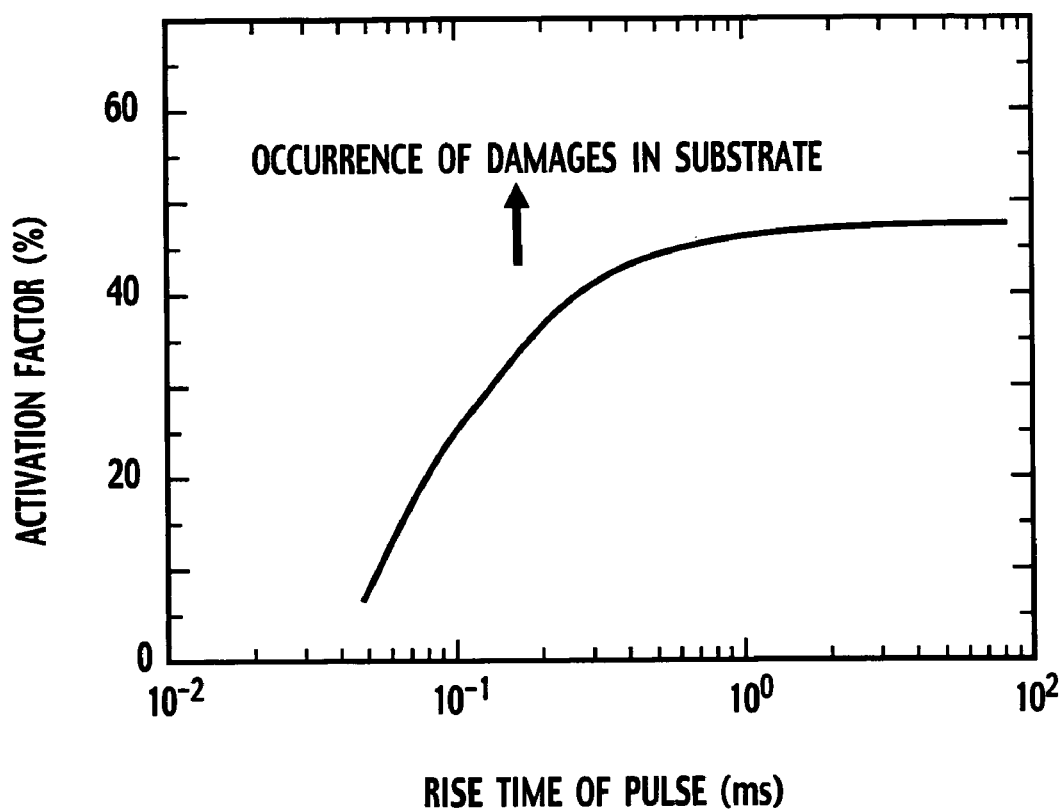
FIG. 14 is a diagram showing an applicable range for impurity activation factors and pulse rise times of a light source in order to activate a source-drain region after ion implantation.

FIG. 14 is a diagram showing an applicable range for impurity activation factors of a source-drain diffused layer and rise times of the waveforms of flashed pulses from a light source.

A rise time that is too rapid results in damage such as slips and dislocations in a silicon substrate before obtaining sufficient activation of the impurities. When a supplemental heating temperature of the substrate and an irradiated energy density are reduced so as to avoid damage in the substrate, sufficient activation cannot be obtained.

However, it is found that the implanted impurities can be sufficiently activated by slowing down a rise time without damaging a substrate. This is achieved because heat can be equally diffused (dispersed) in the depth direction of the substrate (the temperature difference between the front-surface and the interior of the substrate is reduced) by slowing down the rise time, since the slope of the temperature gradient in the thickness direction of the substrate is reduced; localized heating of the front-surface of the substrate is avoided; and temperature differences due to heating efficiency among different materials comprising the patterns, such as polycrystalline silicon, silicon oxide film, silicon nitride film is suppressed.

Further, the implanted impurity ions are activated at a high concentration without generating damage such as slips and dislocations in the substrate because thermal stress generated in the surface and the interior of the silicon substrate is substantially suppressed.

The rise time and a half-width of the flashed pulse can be easily controlled by varying the capacitance of a capacitor and/or the inductance of a coil, comprising a flash lamp discharge circuit.

In the first embodiment, both the anneal after ion implantation for forming a shallow extension region (the first anneal) and the anneal after ion implantation for forming a deep source-drain region were performed by irradiation of the flash lamp light onto the substrate. However, the first anneal can be done by a RTA treatment using a conventional halogen lamp. The conditions for the RTA treatment in this case are shown in FIG. 4.

Figure 4:
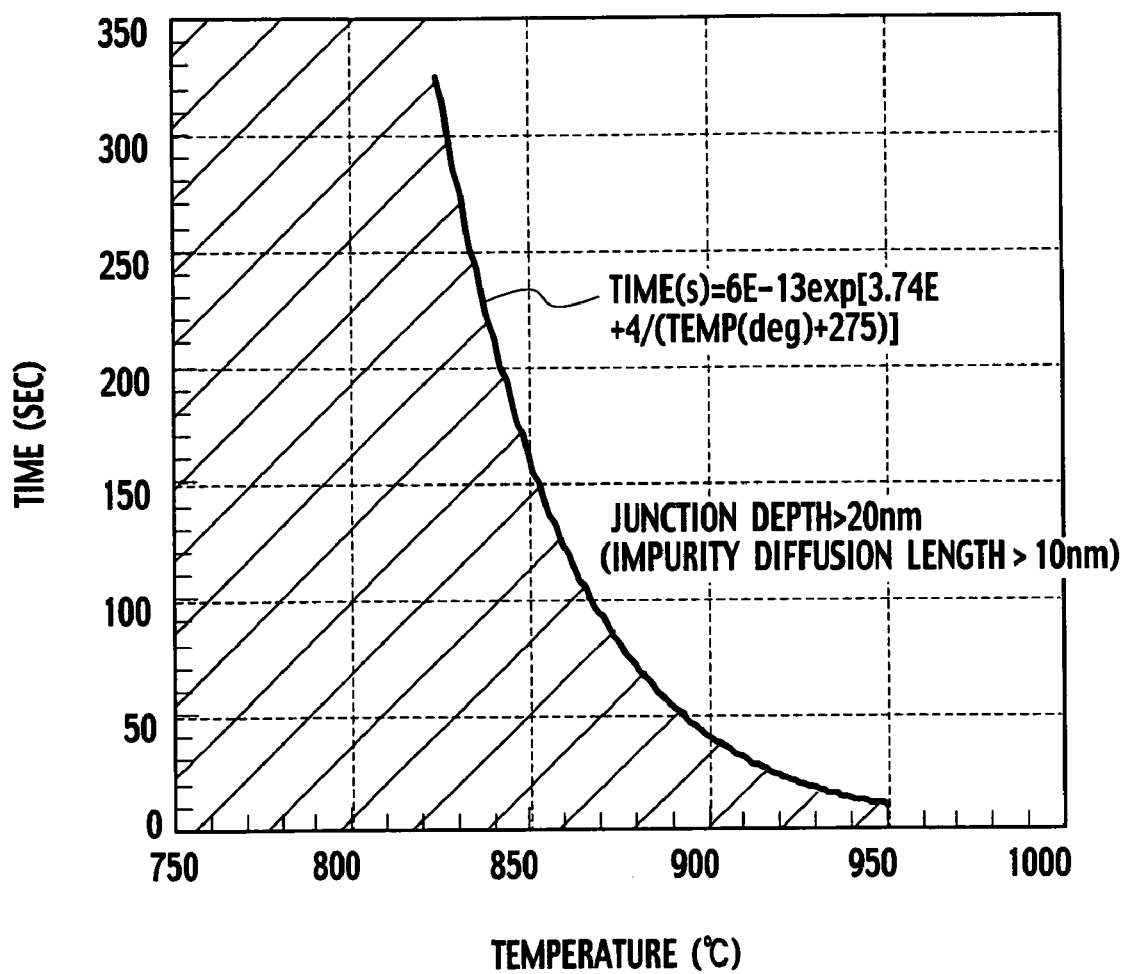
FIG. 4 is a diagram showing an applicable range for temperatures and times in the RTA treatment with a halogen lamp in order to recover crystallinity and to restrain re-diffusion after implanting ions into a source-drain diffused layer.

As shown in FIG. 4, both a substrate temperature of the substrate 1 treated by RTA and a heating time of the RTA treatment are set so as to be included in the hatched process window. Thus, the diffused depth of the impurities can be formed at 10 nm or less and the junction depth of the extension region after the formation of a transistor can be maintained less than or equal to 20 nm. Further, a boundary of this process window can be expressed by the following equation:

$$T=6\times10^{-13}\exp\{3.74\times10^{+4}/(T+275)\} \quad (1)$$

where, "T" refers to a substrate temperature (° C.), and "t" refers to a heating time (second).

In this case, the substrate temperature is more preferably set to 900° C. or less, and the heating time is desirably set to 30 seconds or less. Thus, the diffused depth of the impurities can be less than or equal to 5 nm. Trough this RTA treatment, the impurities do not diffuse deep into the silicon substrate 1. Further, crystalline defects generated in the silicon substrate 1 due to the ion implantation can be eliminated. Eliminating the crystalline defects, the impurities are prevented from diffusing when a temperature of the silicon substrate 1 is increased in subsequent manufacturing processes. However, the impurities cannot be sufficiently activated because the substrate temperature is low.

Although manufacturing processes following FIG. 3C are not especially illustrated, subsequently a silicon oxide film to act as an interlayer insulation film is further deposited on the gate electrode 6 and the source-drain regions 11, 12, and contact holes are opened in the film. A wiring is connected to the gate electrode 6 and the source-drain regions 11, 12 via the contact holes. Through the above processes, a semiconductor device comprising a MOS structure having a shallow extension impurity region of 15 nm or less is achieved.

According to the first embodiment, an extension region 7 of the second conductivity type and an extension region 8 of the first conductivity type, which have low electrical resistance, are shallow, and of excellent quality, can be easily formed without generating crystalline defects or damage such as slips and dislocations in the silicon substrate 1.

As examples of the first embodiment, semiconductor devices will be manufactured in accordance with Example 1 and Example 2 and compared with devices manufactured in accordance with Comparative Example 1 and Comparative Example 2.

EXAMPLE 1

(1) Formation of an Extension Region

By ionizing arsenic (As), the ions were implanted into a surface of a p-well layer 2 with implantation conditions: acceleration energy of 1 keV and a dose of $1\times10^{15}$ cm$^{-2}$. Further, by ionizing boron, the ions were implanted into a surface of an n-well layer 3 with implantation conditions: acceleration energy of 0.2 keV and a dose of $1\times10^{15}$ cm$^{-2}$.

Next, the ions of each impurity were activated by irradiating a flash lamp light based on a supplemental heating temperature of a silicon substrate at 450° C. The number of pulse irradiated was one, the irradiation energy was 80 J/cm$^2$, a half-width of the pulse was 10 milliseconds, and a time to reach the pulse peak was 5 milliseconds.

As mentioned above, extension regions 7, 8 with the thickness of 15 nm or less of n-type and p-type, respectively were formed in the p-well layer 2 and the n-well layer 3.

(2) Formation of Source-Drain Regions

Ionizing phosphor (P), the ions were implanted into the surface of the p-well layer 2 on the implantation conditions: acceleration energy 10 keV; a dose $3\times10^{15}$ cm$^{-2}$. Further, ionizing boron, the ions were implanted into the n-well layer 3 on the implantation conditions: acceleration energy 4 keV; a dose $3\times10^{15}$ cm$^{-2}$.

Next, the ions of each impurity were activated by irradiating flash lamp light on the conditions: supplementary heating temperature of a silicon substrate 1 450° C.; the number of pulse irradiation times 1 time; irradiation energy 80 J/cm$^2$; a half-width of the pulse 10 milliseconds; a time to reach the pulse peak 5 milliseconds.

As mentioned above, formed were source-drain regions 11, 12 apart from a gate electrode 6 and adjacent to the previously formed extension regions 7, 8.

COMPARATIVE EXAMPLE 1

A semiconductor device was manufactured by the same processes as in Example 1 except that flash lamp light with a pulse half-width of 0.5 milliseconds and a time to reach the pulse peak of 0.2 milliseconds were used during formation of source-drain regions 11, 12.

EXAMPLE 2

A semiconductor device was manufactured by the same processes as in Example 1 except that flash lamp light with a pulse half-width of 3.0 milliseconds and a time to reach the pulse peak of 0.80 milliseconds were used during formation of source-drain regions 11, 12.

COMPARATIVE EXAMPLE 2

A semiconductor device was manufactured by the same processes as in Example 1 except that flash lamp light with a pulse half-width of 3.0 milliseconds and a time to reach the pulse peak of 0.08 milliseconds were used during formation of source-drain regions 11, 12.

The semiconductor devices manufactured according to examples 1 and 2 and comparative examples 1 and 2 were evaluated as follows.

Junction Leakage Current

Cumulative probability of the planar distribution in the surface of a wafer was calculated for junction leakage currents of the pn junctions between the p-well layers 2 and the extension regions 7, the source-drain regions 11, and the pn junctions between the n-well layers 3 and the extension regions 8, and the source-drain regions 12 in a plurality of elements disposed in the wafer of the silicon substrate 1. The results are shown in FIG. 5 and FIG. 6 respectively.

Figure 5:
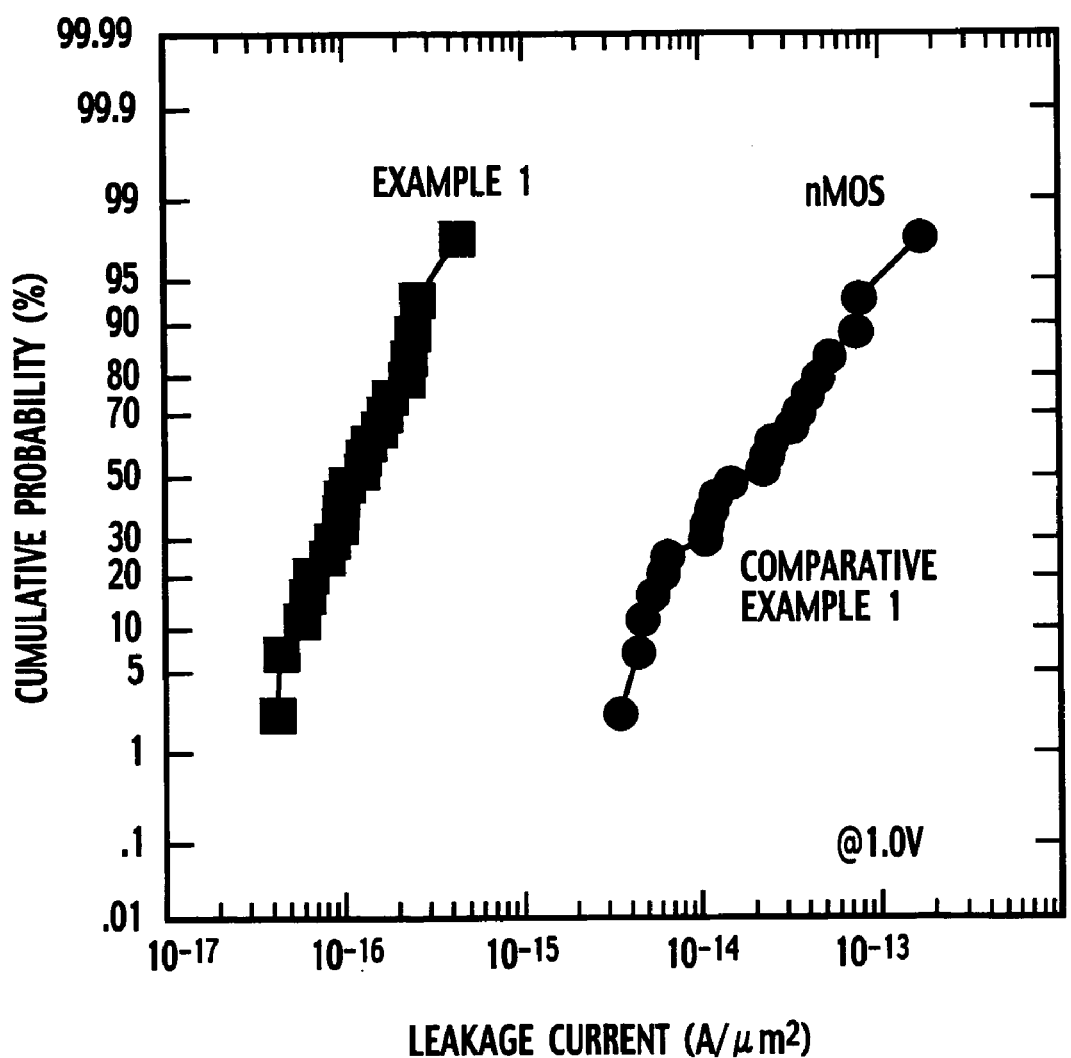
FIG. 5 is a diagram showing cumulative probability of the planar distribution of junction leakage currents in a wafer surface for an n-MOSFET of a semiconductor device manufactured in Example 1 and in Comparative Example 1.
Figure 6:
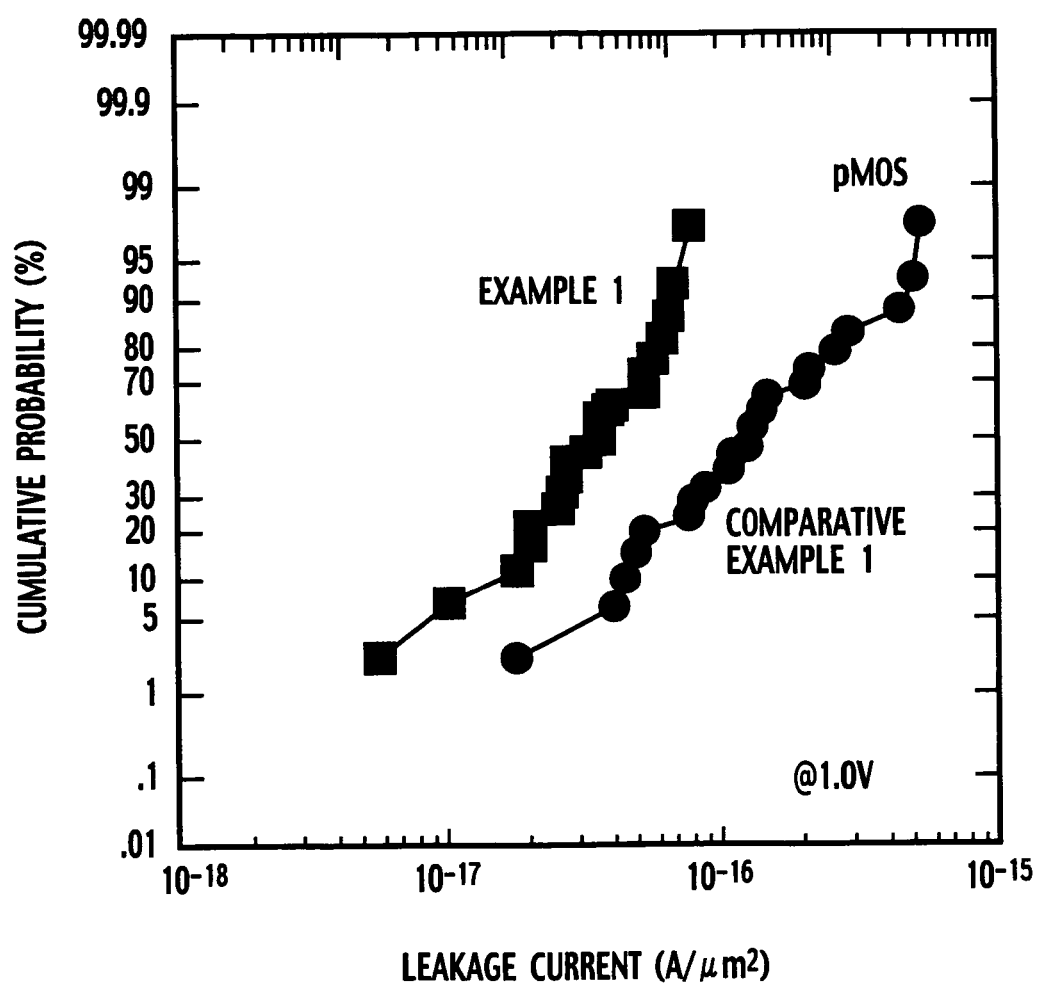
FIG. 6 is a diagram showing cumulative probability of the planar distribution of junction leakage currents in a wafer surface for a p-MOSFET of a semiconductor device manufactured in Example 1 and in Comparative Example 1.

According to FIG. 5 and FIG. 6, it is seen that the junction leakage currents are restrained to a large extent (logarithm of abscissa) and the pn junctions are formed in both the p-well layers 2 and the n-well layers 3 of the semiconductor device manufactured according to Example 1, as compared with the semiconductor device manufactured according to comparative example 1. Also in Example 2 and Comparative Example 2, it is seen that relatively large leakage currents were observed for the semiconductor device of the Comparative Example 2, but the junction leakage currents were $10^{-15}$ A/$\mu m^2$ or less in the semiconductor device of Example 2. The result suggests that in the first embodiment, the defects in the source-drain impurity diffused layer due to the ion implantation have been sufficiently repaired and that there is no damage to the silicon substrate after the anneal.

Defects and Damage

Employing annealed samples obtained, the devices were microscopically observed. The observation was carried out focusing mainly on the existence of damage in the substrate before and after the anneal and on the existence of damage, such as crystalline defects, such as dislocations in the sample surface using, for example, an optical microscope, a scanning electron microscope (SEM), or a transmission electron microscope (TEM).

As a result, it was observed that damage such as crystalline defects and damage in the substrates were not observed in Examples 1 and 2 after the anneal treatment, but in the Comparative Example 1, 2, deformations due to melting and damage in the substrate due to crystalline defects, such as slip, stacking faults, and dislocations were observed in both Comparative Examples 1 and 2.

Sheet Resistance in Impurity Region

After the anneal in Example 1 and Example 2, it was confirmed by measuring sheet resistances of extension regions 7, 8, and source-drain regions 11, 12 that activation of the impurity region had been sufficiently achieved. Sheet resistances were satisfactorily low in Examples 1, 2 and especially in Example 1, the planar variance a of the sheet resistances of a plurality of the elements disposed in the wafer of the silicon substrate 1 was less than 1%.

(Second Embodiment)

Figure 15A:
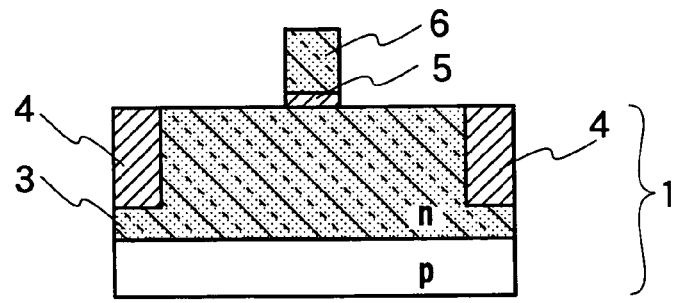
FIG. 15A is a diagram showing a method of manufacturing a semiconductor device of a second embodiment.

After forming an element isolation region 4 such as shallow trench isolation (STI) in a silicon substrate 1 according to a conventional method of manufacturing a MOS transistor of a p-type (first conductivity type), a well layer 3 of an n-type is formed in the preset area (p-MOS region) where a p-channel MOSFET tends to be formed. Further, a silicon oxide film being to compose a gate insulation film 5 and polycrystalline silicon being to compose a gate electrode 6 are sequentially deposited, and the polycrystalline silicon and a silicon oxide film is selectively etched by a RIE process using a photoresist (not shown) for a mask, as shown in FIG. 15A, to form a gate electrode portion comprising the gate insulation film 5 and the gate electrode 6.

Figure 15B:
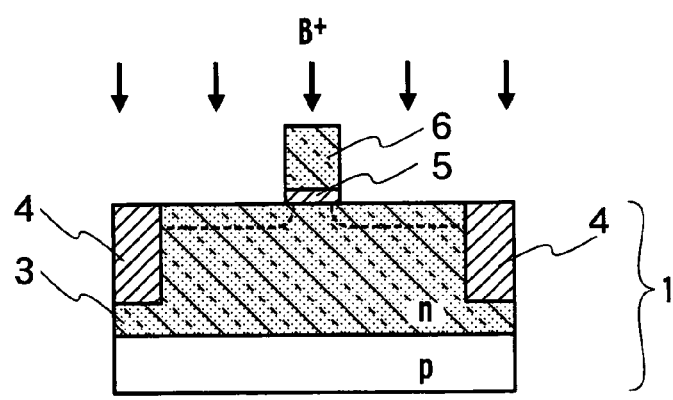
FIGS. 15B to 17B are diagrams showing the method of manufacturing the semiconductor device of the second embodiment.

Next, as shown in FIG. 15B, using the gate electrode 6 and a photoresist (not shown) for masks, impurity ions of the first conductivity type, for example, boron ions ($B^+$) are implanted into the surface of the well layer 3 of the second conductivity type. There is no difference between the implantation conditions above and those in a first embodiment, the same conditions as those can be employed.

Figure 15C:
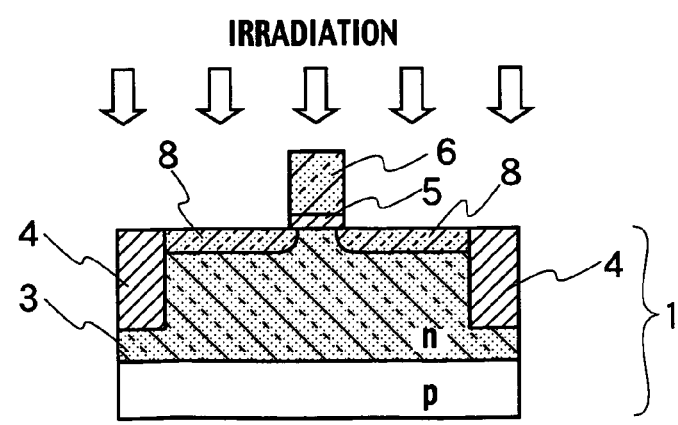

Then, as shown in FIG. 15C, flash lamp light are irradiated onto the whole surface of the substrate in a state where the substrate is heated in a range from 300° C. to 600° C. Irradiation of the flash lamp light is performed typically by one time flash (1 pulse) using, for example, a xenon (Xe) flash lamp. The appropriate process conditions are fundamentally not different from those of the first anneal in a first embodiment. By this heating with the flash lamp, the implanted impurity ions are activated, and at the same time crystalline defects in the region where the impurity ions have been implanted are recovered and an extension region 8 of first conductivity type adjacent to the gate electrode 6 is obtained.

Besides, as in the case of a first embodiment, the activation process at this step can be performed not only by flash lamp annealing but also by a RTA treatment using a halogen lamp. The conditions of annealing at this step are preferably 900° C. or less for the substrate temperature and 10 seconds or less for the duration of heating. Even by this anneal, the impurity ions do not diffuse deep into the substrate and the impurity element is activated, and crystalline defects in the impurity region are recovered as well as the shallow extension region 8 can be formed.

Figure 16A:
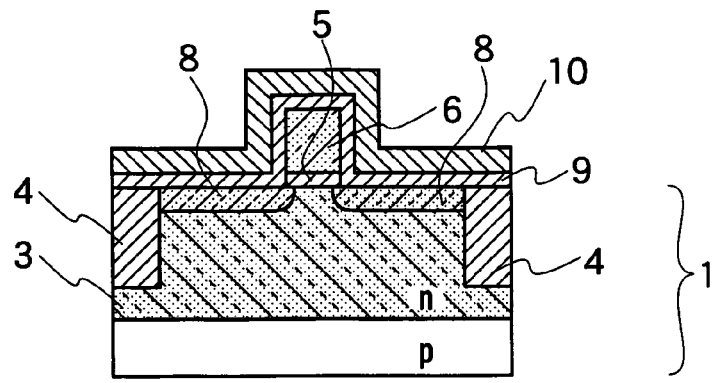

In a second embodiment particularly, as shown in FIG. 16A, subsequently a silicon oxide film 9 is formed based on LPCVD, and a silicon nitride film (HCD-SiN film) 10 is additionally formed based on a low temperature process such as LPCVD from hexachlorodisilane ($Si_2Cl_6$).

The formation of the silicon nitride film 10 is preferably performed in a range of film deposition temperatures from 450° C. to 600° C. The film deposition temperature lower than the above range is not preferable resulting in low productivity. Also, the film deposition temperature exceeding the above range is not preferable because rediffusion and inactivation are liable to occur. From this point of view, the film deposition temperature less than or equal to 550° C. is much more preferable. Thickness of each film is 5 nm to 20 nm for the silicon oxide film 9, 30 nm to 60 nm for the silicon nitride film 10.

Further, as the method of forming silicon nitride film 10 on a silicon substrate, there is a method of depositing a DCS-SiN film from dichlorosilane ($SiH_2Cl_2$) other than the HCD-SiN. When the DCS-SiN film is used, resistance to etching with a HF solution can be enhanced. However, a miniaturized transistor cannot be formed owing to degradation of element characteristics, for example, increase in diffusion layer electrical resistance due to inactivation of the impurities in the extension region 8, induction of short channel effect due to re-diffusion of the impurities, because the film deposition temperature is usually raised up to 700 to 780° C. in order to increase productivity. Therefore, the method of forming a film described in a second embodiment comes to be very effective in producing miniaturized transistors.

Figure 16B:
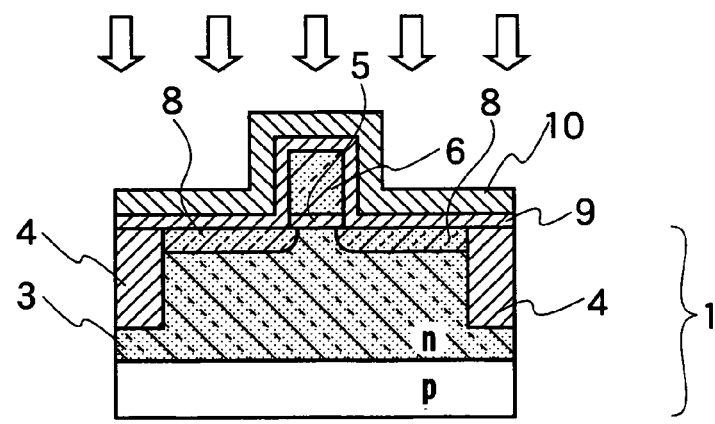

Then, as shown in FIG. 16B, a pulsed lightuch as flash lamp light is irradiated onto silicon nitride film 10 in a state where silicon nitride film 10 is heated preferably in a range of 300° C. to 600° C. Heating is conducted typically by heating the substrate itself within the same temperature range. For the flash lamp can be employed a xenon (Xe) flash lamp.

The irradiation is performed typically by one pulse at one time flash of irradiation of flash lamp light. Preferably, the irradiation time is 1 millisecond to 100 milliseconds by a half-width of the pulse, and energy of the light, which is dependent on a half-width of the pulse, is 45 J/cm$^2$ to 110 J/cm$^2$ at the half-width of 10 milliseconds. When the half-width of the pulse is below this range, thermal stress generated in the silicon substrate will be undesirably increased, and when it is beyond this range, the impurities are liable to re-diffuse, and both the cases will never be preferable. With regard to the irradiation energy, when it is below the range above, activation will be insufficient, and when it is beyond the range above, thermal stress generated in the silicon substrate will be undesirably increased, and both the cases will never be preferable.

Further, the rise time of the pulse is preferably 0.3 milliseconds to 30 milliseconds. A shorter rise time of the pulse is not preferable because of resulting in increased thermal stress generated in the silicon substrate. On the contrary, a longer one is also not preferable because of resulting in occurrence of the re-diffusion and the inactivation of the impurity ions.

Besides, with regard to formation of a so-called sidewall spacer with the silicon nitride film 10, may be considered such a process sequence not that the heating treatment is performed with the flash lamp light immediately after depositing the silicon nitride film 10 as in the present a second embodiment, but that a heat treatment process is performed with a flash lamp after etching the silicon nitride film 10 by a RIE to make the film selectively remain on the side walls of the gate electrode 6 and then the silicon oxide film 9 is removed with a dilute hydrofluoric acid solution. However, the irradiation with a flash lamp in a state where the whole surface is covered with the same kind of film, as in the present a second embodiment, is very effective in improving the process, because not only homogeneous planar distribution of the temperature can be achieved but also the stress generated due to the difference between thermal expansion coefficients of different materials can be relaxed resulting in restraint on occurrence of slips or defects.

Figure 16C:
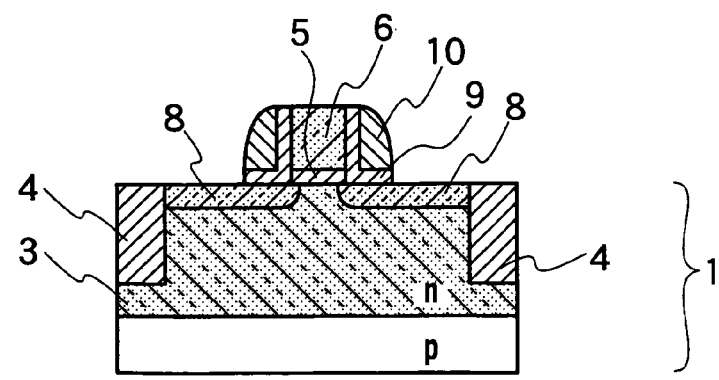

After irradiating the flash lamp light, a sidewall spacer having a multi-layered structure as shown in FIG. 16C is formed by etching the silicon nitride film 10 by a RIE for the film to remain selectively on the sidewall of the gate electrode 6 and further etching the silicon oxide film 9 with a dilute hydrofluoric acid solution. The reason why the silicon oxide film 9 is not etched by the RIE is because the shallow extension region 8 must be prevented from being removed through generation of diggings of the underlying silicon substrate 1.

Figure 17A:
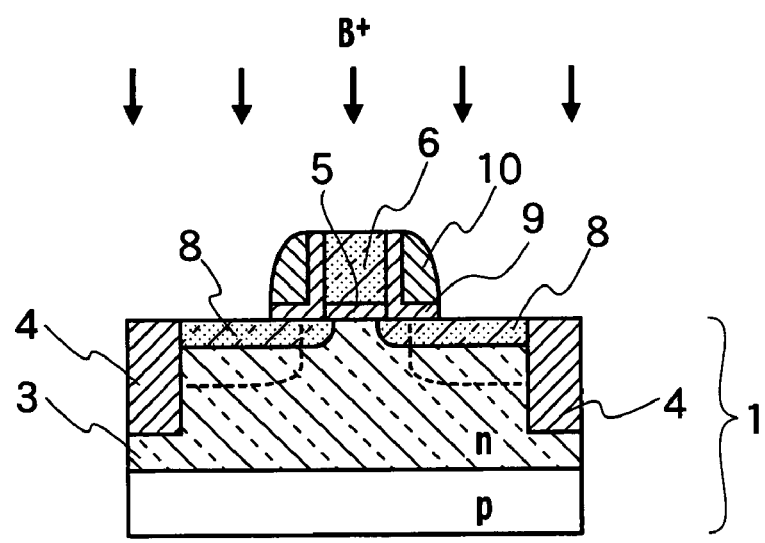

Next, as shown in FIG. 17A, impurities of the first conductivity type are implanted using the gate electrode 6 and the sidewall spacer composed of the silicon oxide 9 and the silicon nitride film 10 for masks. On this occasion, the conditions of implantation such as a dose, acceleration energy are determined considering a source-drain region 12 which will be formed in this implanted area through the following activation anneal and apart from the end portion of the gate electrode 6. Further, the impurity ions concerned are implanted also into the gate electrode 6 by the above ion implantation.

Figure 17B:
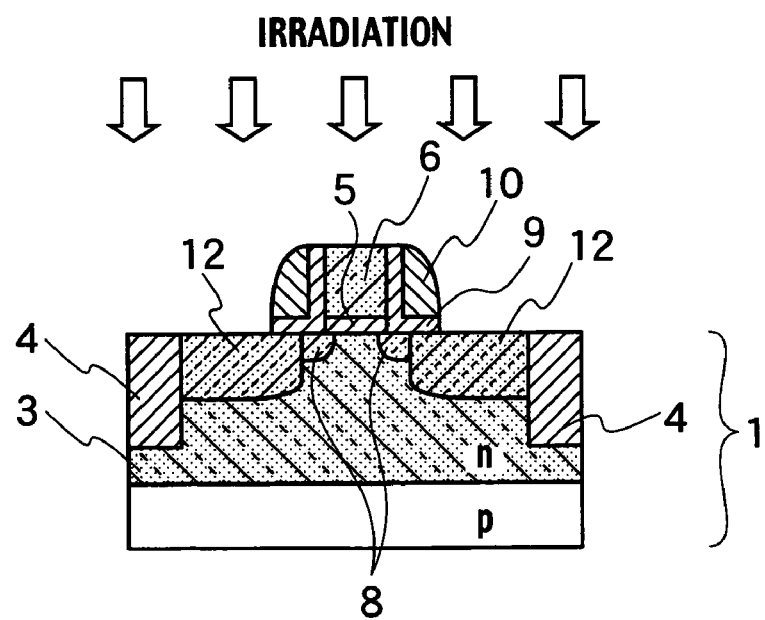

And then, as shown in FIG. 17B, the implanted impurities are activated by irradiating flash lamp light onto the whole surface of the substrate. The preferable irradiation conditions are not basically different from those of the activation anneal shown in FIG. 3C in a first embodiment. By the irradiation of the flash lamp light, crystalline defects in the region where the impurity ions have been implanted are recovered as well as the implanted impurity ions are activated, and formed is the source-drain region 12 apart from the end portion of the gate electrode 6.

Besides, another method such as a RTA treatment with a conventional halogen lamp can be taken into consideration as the method of densifying the silicon nitride film 10. However, heat treatment at a temperature of 1000° C. or higher is necessary for the film to densify to such an extent that enhancement of etching resistance can be seen as in the present a second embodiment. In order to achieve the maximum peak temperature of 1000° C. or higher with a halogen lamp even if the flashing is stopped immediately after a temperature has reached the desired value at least approximately 2 to 3 seconds should undesirably pass off through a high temperature zone of 900° C. or higher. During this passing, the impurities in the extension region 8 of the first conductivity type formed in the underlying silicon substrate 1 will undesirably re-diffuse to induce short channel effect resulting in degradation of the element characteristics. When a flash lamp is employed on the contrary, the heat treatment of a short instant, for example, of 100 milliseconds or less is available, and there is no anxiety about having any effect on an impurity profile and inactivation in the diffused layer.

The processes after forming the source-drain region 12 are not illustrated, and a spontaneous oxide film of the silicon substrate 1 is etched with a dilute hydrofluoric acid solution, and a metal film for forming silicide on the gate electrode 6 and the silicon substrate 1, for example a nickel (Ni) film is deposited by a spattering process, and then a nickel silicide (NiSi) layer is selectively formed on the silicon substrate 1 and the gate electrode 6 by a RTA treatment. Sequentially, depositing a silicon oxide film of approximately 500 nm by a CVD process to form an interlayer insulation film, then forming a contact-hole through the interlayer insulation film, wirings to a source-drain electrode, the gate electrode, etc. are formed by embedding a metal film being to compose the wirings. Thus accomplished is the basic structure of a semiconductor device of a second embodiment having the extension region 8 of the first conductivity type as shallow as 15 nm or less.

According to the second embodiment, the silicon nitride film 10 with good hydrofluoric acid resistance can be formed avoiding generation of damage in the substrate, maintaining a sufficient activation factor, and without having any substantial effects on the impurity profile of the underlying impurity diffused layer, namely, the shallow extension region 8 of the first conductance type. Therefore, unintentional etching of the silicon nitride film 10 is avoided even by the hydrofluoric acid treatment, and an excellent sidewall of the gate electrode 6 can be formed. Consequently, a high performance semiconductor device corresponding to further miniaturization can be manufactured at a good yield.

As examples of the second embodiment, semiconductor devices will be manufactured in Example 3 and Example 4 and compared with those manufactured in Comparative Example 3.

EXAMPLE 3

(1) Formation of an Extension Region

Ionizing boron (B), the ions were implanted into a surface of an n-well layer 3 under the condition as follows: acceleration energy was 0.2 keV, and a dose was $1 \times 10^{15}$ cm$^{-2}$. Next, the implanted impurity ions were activated with a xenon flash lamp on the condition as follows: the supplementary heating temperature of a semiconductor substrate 1 was 450° C.; the number of pulse irradiation was one; irradiation energy was 80 J/cm$^2$; a half-width of the pulse was 10 milliseconds; and a time to reach the pulse peak was 5 milliseconds.

As mentioned above, a shallow p-type extension region 8 with the thickness of 15 nm or less was formed.

(2) Formation of a Silicon Nitride Film

After depositing a silicon oxide film 9 by 15 nm by a LPCVD process, a silicon nitride film 10 was deposited by an LPCVD process using hexachlorodisilane at a film deposition temperature of 550° C. by 50 nm. Then, one pulse of xenon flash lamp light was irradiated from the upper side of the silicon nitride film 10 down onto the whole surface of the film at a state where the substrate has been preheated at 450° C. A half-width of the pulse was 10 milliseconds; irradiation energy was 80 J/cm$^2$; and a time to reach the pulse peak was 5 milliseconds.

(3) Formation of a Source-Drain Region

Ionizing boron (B), the ions were implanted with the condition as follows: acceleration energy was 4 keV, and a dose was $3 \times 10^{15}$ cm$^{-2}$. Next, the implanted impurity ions were activated with a xenon flash lamp under the condition as follows: the supplemental heating temperature of a semiconductor substrate 1 was 450° C.; the number of pulse irradiation was one; irradiation energy was 80 J/cm$^2$; a half-width of the pulse was 10 milliseconds; and a time to reach the pulse peak was 5 milliseconds.

As mentioned above, a deep source-drain region 12 apart from the gate electrode 6 and adjacent to a shallow extension region 8 having been formed previously.

COMPARATIVE EXAMPLE 3

A semiconductor device of the second embodiment was manufactured by the same processes as those in Example 3 except that the xenon flash lamp light were not irradiated when the silicon nitride film 10 was formed.

EXAMPLE 4

A semiconductor device of the second embodiment was manufactured by the same processes as those in Example 3 except that irradiation energy was 25 J/cm$^2$ when the silicon nitride film 10 was formed.

The semiconductor devices manufactured according to Examples 3 and 4, and Comparative Example 3 were evaluated as follows.

(Electron-Microscopic Observation of Gate Electrode Portion)

The features of a section of the gate electrode portion composed of the gate insulation film 5 and the gate electrode 6 in the semiconductor devices manufactured according to Example 3 and Comparative Example 3 were observed using a scanning electron microscope (SEM).

As a result, in the case of Example 3, the shape of the gate electrode 6 was kept as it was without recession of the silicon nitride film 10 composing the sidewall of a gate, in the case of Comparative Example 3 on the contrary, the silicon nitride film 10 composing the sidewall of a gate receded to a large extent by etching resulting in undesirable exposure of the side of the polycrystalline silicon composing the gate electrode 6.

The reason why such a result as of Example 3 has been obtained is considered because the chlorine and the hydrogen stored in the silicon nitride film 10 is removed by the heat treatment with the Xe flash lamp light after depositing the silicon nitride film 10 to strengthen Si—N bond and densify the film resulting in enhancement of the etching resistance to an HF solution. Comparative Example 3 shows a result in the case where the above effect did not work. When the silicon nitride film 10 on the sidewall is receded to such a large extent, metal atoms being to compose a silicide enter deep into polycrystalline silicon composing the gate electrode 6 during the following silicide formation process, and there is a possibility to induce electrical failures since the gate insulation film 5 is degraded in reliability due to the above-mentioned metal atoms' entrance, and the gate electrode 6 composed of the polycrystalline silicon is short-circuited with the source-drain region 12 due to difficulty in self-coherent formation of the silicide layer, and so forth.

(Hydrofluoric Acid Resistance of Silicon Nitride Film)

Figure 18:
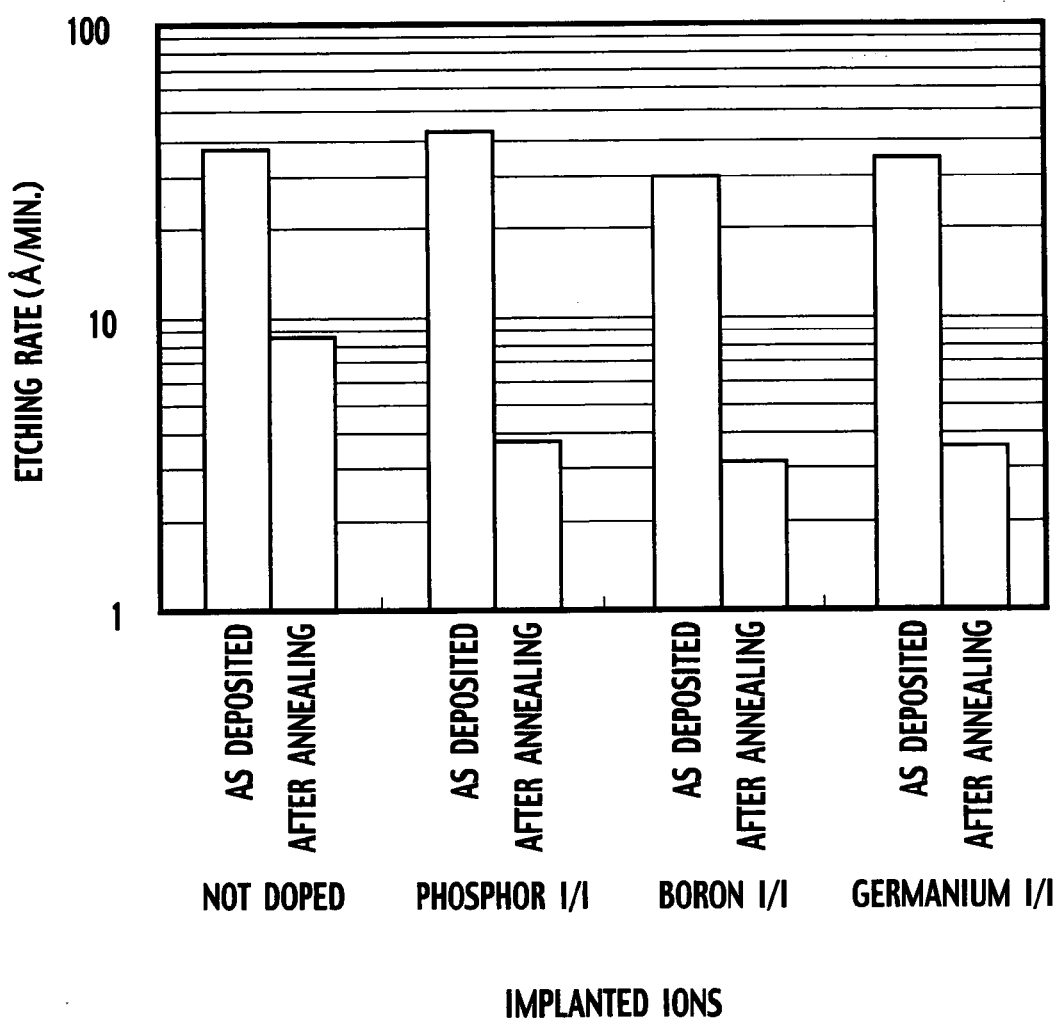
FIG. 18 is a diagram showing etching rate of an HCD-SiN film formed in the shape of a film at 550° C. by a dilute hydrofluoric acid solution before and after flash lamp annealing.

The etching rate for a dilute hydrofluoric acid solution of the silicon nitride film 10 in a semiconductor device manufactured according to Example 4, was compared between before and after the flash lamp irradiation. The hydrogen fluoride concentration of the dilute hydrofluoric acid solution was 0.25 wt. %. The results are shown in FIG. 18 (data designated as "not doped").

It is seen that the etching resistance to hydrogen fluoride has been greatly improved (reduction of the etching rate by ¼ or less) by the irradiation treatment with the flash lamp light.

(Third Embodiment)

The process of the present embodiment is such that ion implantation (FIG. 17A) for forming a source-drain region 12 is carried out via a silicon nitride 10, after the step for depositing the silicon nitride film 10 by the low temperature process (FIG. 16A), and before the step for irradiating the flash lamp light onto the silicon nitride film 10 (FIG. 16B) in a second embodiment. By employing the process sequence above, both the step for ion implantation corresponding to FIG. 17A and the step for activating the source-drain region 12 with the flash lamp corresponding to FIG. 17B as described in a second embodiment are omitted.

The silicon nitride film 10 is a film having light-transparency. However, when the process sequence above is employed, the efficiency for heating during irradiation of the flash lamp light is enhanced and densification of the silicon nitride 10 is further accelerated by giving light-absorbency by letting the film include impurities by ion implantation. Therefore, implanting ions into silicon nitride film 10 before irradiating a pulsed light is in itself advantageous, and has good effect on silicon nitride film 10.

Further, since the flash lamp light are irradiated through the silicon nitride film 10, formation (activation) of the source-drain region 12 as well as densification of the silicon nitride 10 can be performed when the process sequence above is employed, and it is advantageous in that the number of process steps can be decreased.

Besides, the IV-group elements can be beforehand implanted through the silicon nitride film 10 before processing the sidewall of a gate. Since the IV-group elements are nonconductive elements having no effect on electrical characteristics, they can be implanted into the preset area where a MOSFET of either type in the semiconductor device tends to be formed independent of whether it is a channel of the first conductivity type or that of the second conductivity type.

As the example of The third embodiment, a semiconductor device was manufactured in Example 5.

EXAMPLE 5

Boron ions were implanted into the whole surface of the silicon nitride film 10 from its upper side, on the conditions: acceleration energy 25 keV; a dose $6 \times 10^{15}$ cm$^{-2}$, after the step for depositing the silicon nitride film 10 by the low temperature process and also before the step for irradiating the flash lamp light onto the silicon nitride film 10. Sample 5A for evaluating a semiconductor of The third embodiment was obtained by carrying out the processes to the step (corresponding to FIG. 16A) for irradiating the flash lamp lighto as to form the silicon nitride film 10 in the same manner as those in Example 4 except the addition of the step mentioned above.

In the similar manner as above, phosphor ions in place of the boron ions were implanted into the whole surface of the silicon nitride film 10 from its upper side, on the conditions: acceleration energy 60 keV; a dose $6 \times 10^{15}$ cm$^{-2}$, or germanium ions (Ge$^+$) on the conditions: acceleration energy 20 keV; a dose $1 \times 10^{15}$ cm$^{-2}$, and thus Samples 5B and 5C for evaluation were obtained.

(Hydrofluoric Acid Resistance of Silicon Nitride Film)

The etching rate for a dilute hydrofluoric acid solution of the silicon nitride film 10 of the evaluation samples 5A, 5B, 5C manufactured according to Example 5, were compared between before and after the flash lamp irradiation. The concentration of the hydrofluoric acid was the same as that of the dilute hydrofluoric acid solution used in Example 4. The results are shown in FIG. 18 ("phosphor", "boron", "germanium", respectively).

It is seen that the etching resistance of the silicon nitride film 10 to hydrogen fluoride has been further enhanced (reduction of the etching rate by approximately ¹⁄₁₀) by the ion implantation into the nitride film before irradiation with the flash lamp light.

(Fourth Embodiment)

Figure 19A:
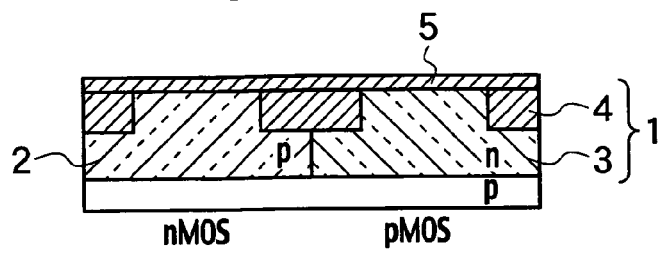
FIGS. 19A to 20C are process diagrams showing a method of manufacturing a semiconductor device of a fourth embodiment.

First, as shown in FIG. 19A, a p-well layer 2 in an n-MOS region of a silicon substrate 1 of the first conductivity type (here, p-type) and an n-well layer 3 in a p-MOS region are formed. Element isolation regions 4 are formed around the periphery of the p-well layer 2 and the periphery of the n-well layer 3. Further, a silicon oxide film being to compose a gate insulation film 5 is formed on the surface of the silicon substrate 1.

Figure 19B:
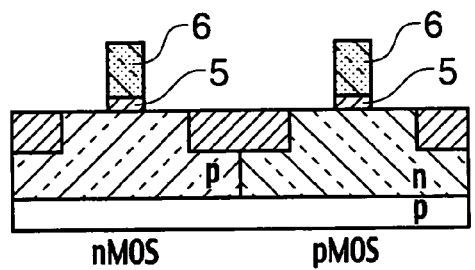

Next, as shown in FIG. 19B, a polycrystalline silicon film being to composing a gate electrode 6 is deposited on the gate insulation film 5. The gate electrode 6 is formed by selectively etching the polycrystalline silicon film by RIE.

By coating the p-MOS region with a photoresist film (not shown) and also using the gate electrode 6 for a mask over the n-MOS region, the V-group atoms to be impurities of n-type, for example, arsenic (As) are ionized and implanted into the n-MOS region on the surface of the silicon substrate 1. The conditions of the ion implantation such as acceleration energy, a dose are adjusted in order to form a shallow extension region 7 of n-type adjacent to the gate electrode 6 by the following activation anneal. At this time, the concentration of the impurity ions implanted into the p-well layer 2 is set so as not to exceed $2 \times 10^{21}$ ions/cm$^3$ at most. However, the concentration of approximately $2 \times 10^{20}$ ions/cm$^3$ at least is necessary to achieve sufficiently low electrical resistance for forming the extension region 7.

After removing the photoresist film, by coating the n-MOS region with a photoresist film in the similar manner as above, III-group atoms to be impurities of p-type, for example, boron (B) are ionized and implanted into the p-MOS region of the silicon substrate 1. The ion implantation conditions of the n-type impurity ions are properly determined in order to form a shallow extension region 8 of p-type by the following activation anneal. However, the concentration of the impurity ions implanted into the n-well layer 3 must be set so as not to exceed $2 \times 10^{21}$ ions/cm$^3$ at most as is the case of ion implantation into the n-MOS region above. But, the concentration of approximately $2 \times 10^{20}$ ions/cm$^3$ at least is necessary to achieve sufficiently low electrical resistance for forming the extension region 8.

Figure 19C:
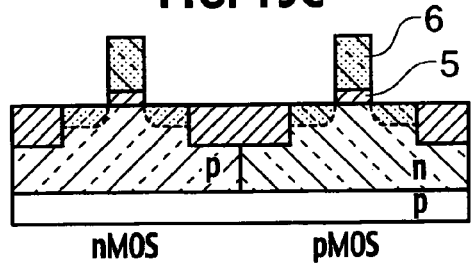

By the ion implantation above (also referred to as "first ion implantation" in the following), impurity regions, indicated with a broken line in FIG. 19C, having the upper concentration limit of implanted ions of $2 \times 10^{21}$ ions/cm$^3$, are formed in the p-type well layer 2 and the n-type well layer 3, respectively.

Figure 19D:
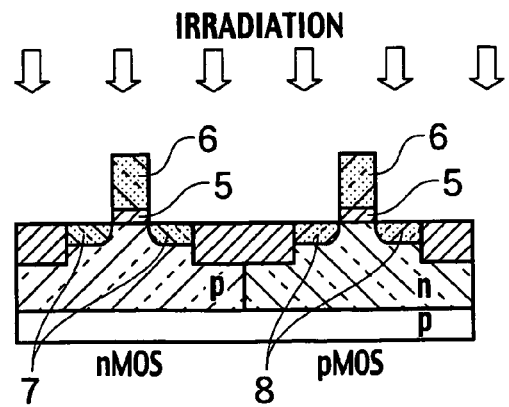

Next, as shown in FIG. 19D, using pulsed light having a pulse width of 100 milliseconds or less, for example, flash lamp light for a heat source, activation anneal of an impurity implanted region is performed. The anneal is such that the silicon substrate 1 is disposed on the hot plate, and the silicon substrate 1 is heated from its front side by the light radiated out of a flash lamp light source in the state where the silicon substrate 1 is heated from its rear side (supplementary heating). For the supplementary heating means, another heating means such as a halogen lamp, a kind of an infrared-light lamp, can be employed in place of the hot plate.

When the supplementary heating temperature of the silicon substrate 1 is too high, ion implantation defects tend to remain more easily due to occurrence of diffusion of the implanted impurity ions and a half-finished advance of solid-state growth. In order to avoid the above problem, the supplementary heating temperature is preferably set at 500° C. or less. However, too low supplementary heating temperature is also not preferable. When the supplementary heating temperature is set low, higher light intensity of the flash lamp light for heating the front-surface of the silicon substrate 1 comes to be necessary for supplementing the situation above. When the silicon substrate 1 is heated by irradiating the flash light light of higher light intensity, thermal stress generated within the silicon substrate 1 undesirably increases resulting in damage to the silicon substrate 1. From this point of view, the supplementary heating is performed at a temperature of 200° C. or higher, and 500° C. or lower.

The duration of supplementary heating the silicon substrate 1 is preferably 3 minutes or less. Too long supplementary heating time is not preferable because not only the productivity decreases but ion implantation defects also tend to remain more easily due to occurrence of diffusion of the implanted impurity ions and a half-finished advance of solid-state growth.

There is little possibility of generation of damage such as slips, dislocations in the interior of the silicon substrate 1 only because of supplementary heating. When the supplementary heating is performed, it is preferable to reduce the rate of temperature increase as low as possible so as not to cause deformation of the silicon substrate. The rate of temperature increase is preferably 20° C./second or less. This is because the silicon substrate 1, especially the patterned one, is liable to bend if the rate of temperature increase is beyond 20° C./second and the silicon substrate 1 is liable to fracture when it is irradiated by flash lamp light at a bent state.

Irradiation of a flash lamp light is performed typically by one time flash (1 pulse) using, for example, a xenon flash lamp. Preferable energy of the light contained in 1 pulse is also dependent on a pulse width of the flash lamp light and on a temperature of supplementary heating. It is preferably in a range of 40 J/cm$^2$ to 60 J/cm$^2$ in the exemplary case where the pulse width is 3 milliseconds and the supplementary heating temperature of the silicon substrate 1 is 350° C. Too low irradiation energy is not preferable because of resulting in insufficient activation. Further, too much irradiation energy is also not preferable because of resulting in increased thermal stress generated in the interior of the silicon substrate 1.

The pulse width, or a full width at half maximum (FWHM) is preferably around 1 millisecond to 100 milliseconds. More preferably, it is from 3 milliseconds to 10 milliseconds. A shorter pulse width than above is not preferable because of resulting in increased thermal stress generated in the interior of the silicon substrate 1. Further too long one is also not preferable because of resulting in undesirable diffusion of the impurities.

By the activation anneal above (also referred to as "first anneal" in the following), a shallow extension region 7 of n-type and a shallow extension region 8 of p-type both adjacent to the gate electrode 6 are formed, respectively in the p-type well layer 2 and the n-type well layer 3, as shown in FIG. 19D.

Figure 20A:
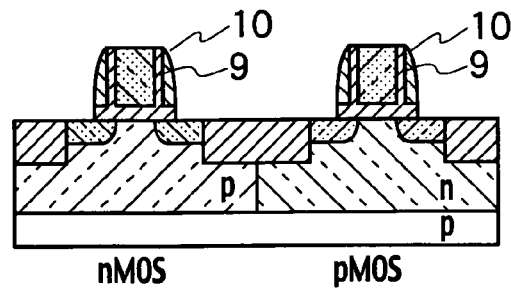

Next, as shown in FIG. 20A, a sidewall spacer with a multi-layered structure composed of a silicon oxide film 9 and a silicon nitride film 10 is formed on the sides of the gate electrode 6 and the gate insulation film 5. For this purpose, the silicon oxide film 9 is deposited at the deposition temperature of 600° C. or less and the silicon nitride film 10 is further deposited thereon at the deposition temperature of 600° C. or less on the whole front-surface of the semiconductor substrate 1, so as to cover all of the formed gate electrode 6, the exposed p-type well layer 2 and n-type well layer 3. The deposition of the silicon oxide film 9 and the silicon nitride film 10 is preferably performed by a low-pressure chemical vapor deposition (LPCVD) process.

Then, the silicon nitride film 10 and the silicon oxide film 9 are etched by RIE process to make the silicon nitride film 10 and the silicon oxide film 9 selectively remain on the side walls of the gate electrode 6 and the gate insulation film 5. Thus, formed is a sidewall spacer with a multi-layered structure composed of the silicon oxide film 9 and the silicon nitride film 10.

Next, ion implantation of impurities is performed again (also referred to as "second ion implantation" in the following), impurity regions, indicated with a broken line in FIG. 20B, in the p-well layer 2 and the n-well layer 3 both of which are deeper than the extension regions 7, 8. For this purpose, by coating the n-type well layer 3 with a photoresist film (not shown) and also using the gate electrode 6 and the sidewall spacer composed of the silicon oxide film 9 and the silicon nitride film 10 for a mask over the p-type well layer 2 on which themselves are formed, the impurities of n-type are implanted into the surface of the p-type well layer 2. The conditions of the ion implantation such as acceleration energy, a dose are adjusted in order to form a source-drain region 11 deeper than the extension region 7 which is apart from the gate electrode 6 by the following activation anneal. Consequently, the concentration of the impurity ions implanted into the p-well layer 2 is preferably set so as not to exceed $2 \times 10^{21}$ ions/cm$^3$ at highest. However, the concentration of approximately $2 \times 10^{20}$ ions/cm$^3$ at least is necessary to achieve sufficiently low electrical resistance for forming the source-drain region 11.

In the similar manner, by coating the p-type well layer 2 with a photoresist film (not shown) and also using the gate electrode 6 and the sidewall spacer composed of the silicon oxide film 9 and the silicon nitride film 10 for a mask over the n-type well layer 3 on which themselves are formed, the impurities of p-type are implanted into the surface of the n-type well layer 3. The conditions of the ion implantation such as acceleration energy, a dose are adjusted in order to form a source-drain region 12 deeper than the extension region 8 which is apart from the gate electrode 6 by the following activation anneal. Consequently, the concentration of the impurity ions implanted into the n-well layer 3 is preferably set so as not to exceed $2 \times 10^{21}$ ions/cm$^3$ at highest. However, the concentration of approximately $2 \times 10^{20}$ ions/cm$^3$ at least is necessary to achieve sufficiently low electrical resistance for forming the source-drain region 12. Additionally, by the second ion implantation, even the corresponding impurity ions are also implanted into the gate electrode 6.

Figure 20B:
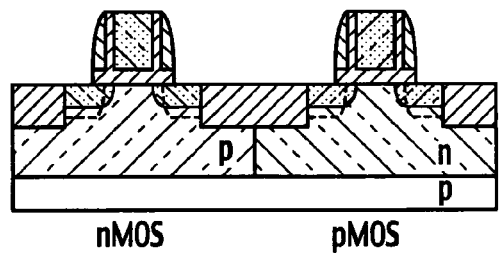
Figure 20C:
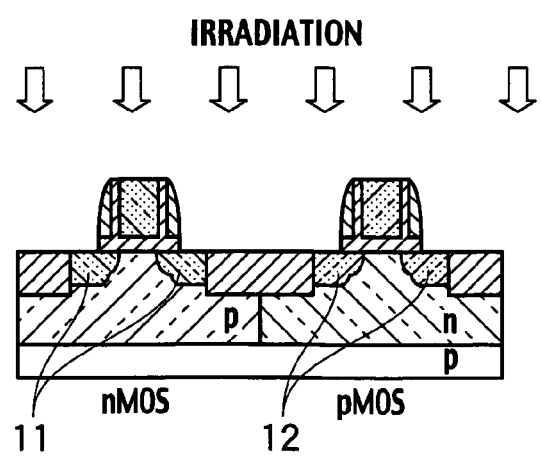

Next, as shown in FIG. 20C, using pulsed light having a pulse width of 100 milliseconds or less, for example, flash lamp light for a heat source, an activation anneal (also referred to as "second anneal" in the following) of the implanted impurities is performed. In the same manner as in the first anneal, the silicon substrate 1 is supplementary heated using an supplementary heating means. The heating temperature is preferably in a range from 200° C. to 500° C., as that in the first anneal. Too low supplementary heating temperature is not preferable resulting in insufficient activation. The too high one is not preferable because ion implantation defects tend to remain more easily due to occurrence of diffusion of the implanted impurity ions and a half-finished advance of solid-state growth. The supplementary heating time is preferably 3 minutes or less. When the supplementary heating time is longer than 3 minutes, the productivity decreases as well as the impurities diffuse or solid-state growth advances. Therefore, too long one is not preferable since ion implantation defects tend to remain more easily.

The second anneal is performed in such a manner, as shown in FIG. 20C for example, that a xenon flash lamp is flashed above the surface of silicon substrate 1 and the xenon flash lamp light is irradiated from the upper side of the surface of the silicon substrate 1 down onto the front-surface of the whole surface of the silicon substrate 1.

The irradiated xenon flash lamp light are transmitted through the sidewall composed of the silicon nitride film 10 and the silicon oxide film 9 and are absorbed into the gate electrode 6, the extension regions 7, 8 within the silicon substrate 1, and the impurity region indicated with a broken line in FIG. 20B. The regions having absorbed the xenon flash lamp light increase in temperature and the maximum temperature is supposed to exceed 1100° C. Thus, the impurities implanted into the gate electrode 6, the extension regions 7, 8 and the deep impurity region indicated with a broken line in FIG. 20B are activated owing to the high temperature above. By the second anneal, the gate electrode 6, the extension regions 7, 8 and the deep impurity region indicated with a broken line in FIG. 20B are reduced in electrical resistance to form the source-drain regions 11, 12. By the processes described above, the fundamental structure of the semiconductor device of the forth embodiment is completed.

Besides, at the steps of the first ion implantation and the second ion implantation, not only ions of the conductivity type which have capability to turn carriers when implanted and activated such as, As$^+$, B$^+$ but also atoms of the nonconductive type which have no capability to turn carriers can be additionally implanted (PAI). The portion of the silicon substrate 1 with which ions of nonconductive type have collided becomes partially amorphous by the energy and comes to have high light absorbance for visible light such as flash lamp light. Therefore, the following anneal with flash lamp light, etc. can enhance the efficiency at activation.

As a nonconductive ion, preferable is such an atom that is easy to form a part of the silicon crystalline lattice by replacing a silicon atom in the lattice and that has a large mass number so as to transfer large energy at the collision. Such a nonconductive atom is typically a germanium atom. When B$^+$ is used as an ion of conductivity type, owing to a small mass number of B$^+$, it is particularly effective in making the silicon substrate 1 amorphous to add a germanium ion implantation step combining therewith.

The manufacturing processes following FIG. 20C are not especially illustrated. Subsequently a silicon oxide film being to act as an interlayer insulation film is further deposited on the gate electrode 6 and the source-drain regions 11, 12, and contact holes are opened in the film. A wiring is connected to the gate electrode 6 and the source-drain regions 11, 12 via the contact holes. By the above processes, a semiconductor device comprising a MOS structure having the shallow extension regions 7, 8 of 20 nm or less is accomplished.

(Examination of Sheet Resistance)

Figure 21A:
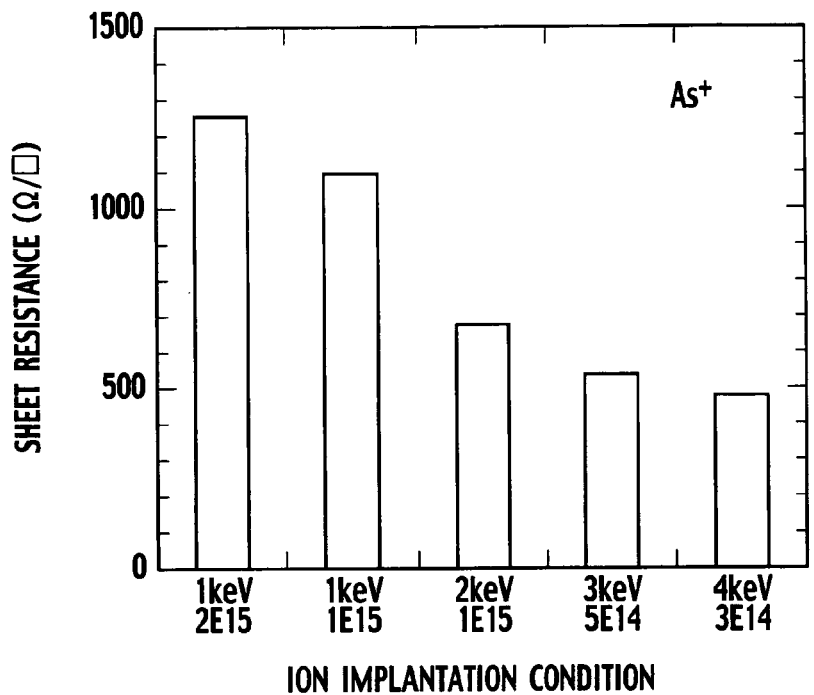
FIG. 21A is a diagram showing measurements of sheet resistances immediately after the activation treatment following the arsenic ion implantation at each ion implantation condition.
Figure 21B:
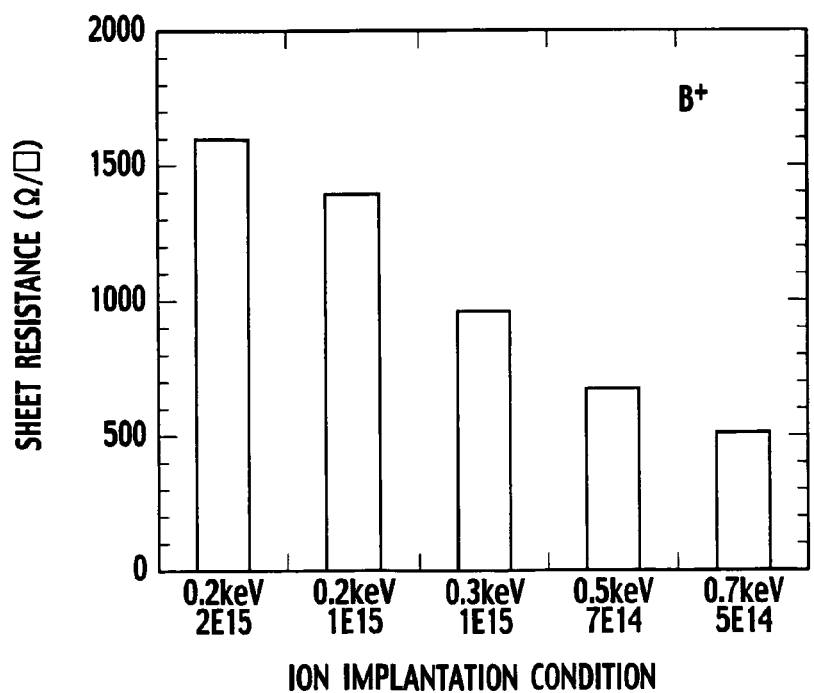
FIG. 21B is a diagram showing measurements of sheet resistances immediately after the activation treatment following the boron ion implantation at each ion implantation condition.

By implanting the impurity ions on the ion implantation conditions that a shallow junction of approximately 10 nm to 15 nm can be obtained and further by the first anneal, Samples 1–10 were formed to examine sheet resistance of the extension regions 7, 8 thereof on the following 10 conditions of ion implantation. The results are shown in FIGS. 21A and 21B.

TABLE 1

Conditions of Ion Implantation

| | Ion Species | Acceleration Voltage (keV) | Dose ($\times 10^{14}$/cm$^2$) |
|---|---|---|---|
| Sample 1 | As$^+$ | 1.0 | 20 |
| Sample 2 | As$^+$ | 1.0 | 10 |
| Sample 3 | As$^+$ | 2.0 | 10 |
| Sample 4 | As$^+$ | 3.0 | 5 |
| Sample 5 | As$^+$ | 4.0 | 3 |
| Sample 6 | B$^+$ | 0.2 | 20 |
| Sample 7 | B$^+$ | 0.2 | 10 |
| Sample 8 | B$^+$ | 0.3 | 10 |
| Sample 9 | B$^+$ | 0.5 | 7 |
| Sample 10 | B$^+$ | 0.7 | 5 |

Figure 22A:
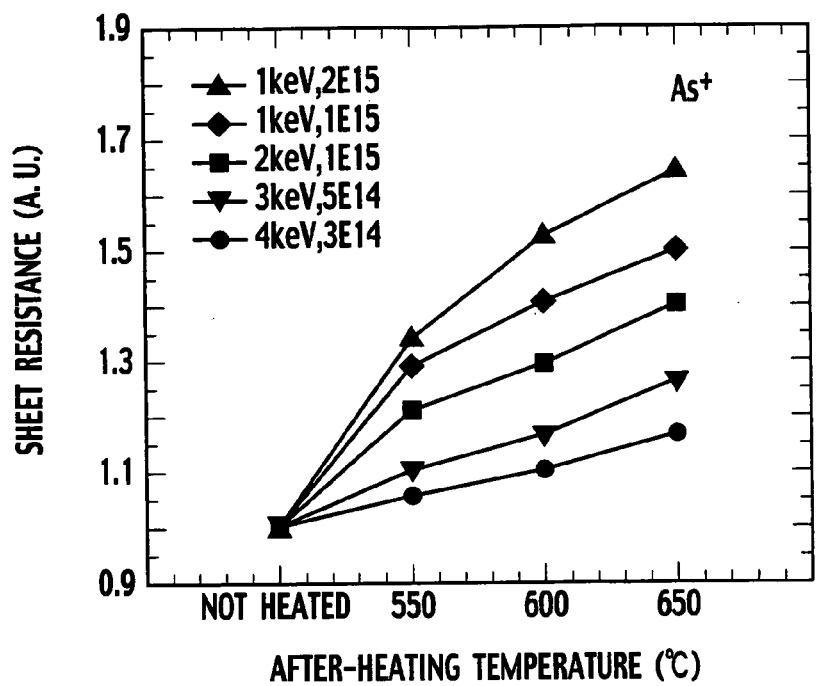
FIGS. 22A and 22B are diagrams showing a result of measurements of sheet resistances after additional furnace annealing simulating an after-heating step, which is conducted after ion implantation and activation treatment.
Figure 22B:
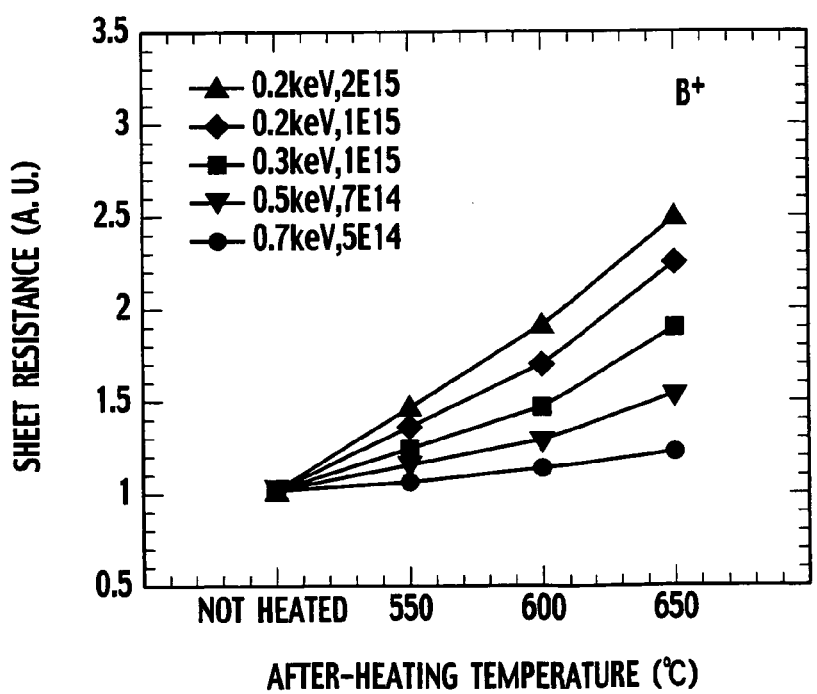

Further, supposing that the step of forming the sidewall spacer which are described while referring to FIG. 20A would be performed as an after-heating process after conducting the first anneal, all of the samples were put into a heating furnace and heated for 180 minutes keeping at each constant temperature of 550° C., 600° C., or 650° C., and the sheet resistance changes were observed. The results are shown in FIG. 22. In FIG. 22, the sheet resistances after the heat treatment in the furnace (after-hating step) are represented by relative values to those before the heat treatment regarding the sheet resistances of each sample before being put into the furnace as a unit.

From these results, when a equivalently shallow junction is intended to obtain, it is seen that the sheet resistances immediately after activation by the first anneal as well as a rate of increase in sheet resistance through the after-hating step can be restricted to a lower level if the ion implantation conditions that acceleration energy of the impurity ions is higher and a dose of the impurity ions is smaller are selected at the step of ion implantation. Further, the higher an after-heating temperature is, the larger is a rate of increase in the sheet resistance through the after-hating step. Still further, when an examination was made in a range of the supplementary heating temperatures higher than 300° C. to 350° C., shown was such a tendency that the higher the supplementary heating temperature of the silicon substrate 1 in the anneal, the higher is the sheet resistance of the impurity region immediately after the anneal as well as the larger is the amount of increase in the sheet resistance through the after-hating step.

Figure 23A:
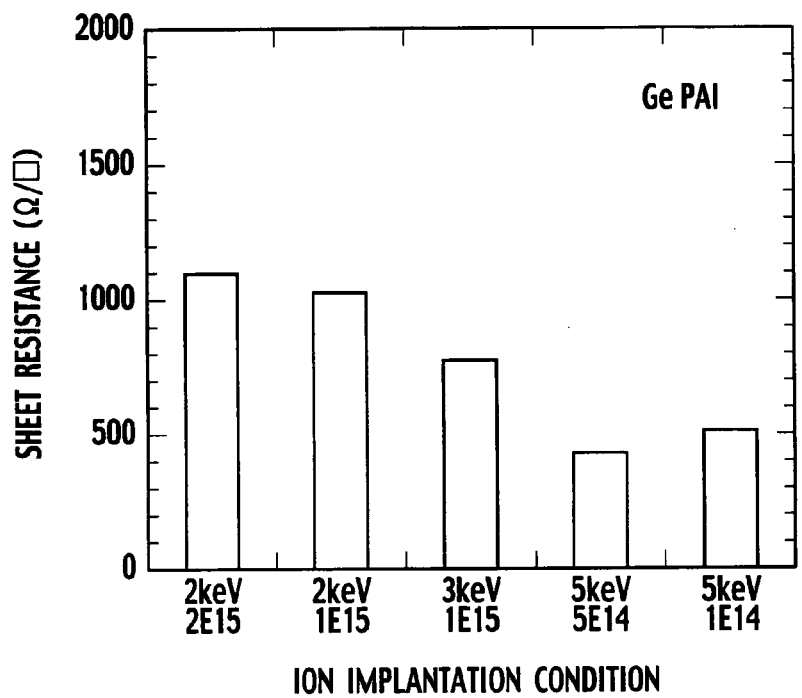
FIG. 23A is a diagram showing measurements of sheet resistances of the samples implanted with $B^+$ ions immediately after activation as well as after furnace annealing simulating the after-heating step.
Figure 23B:
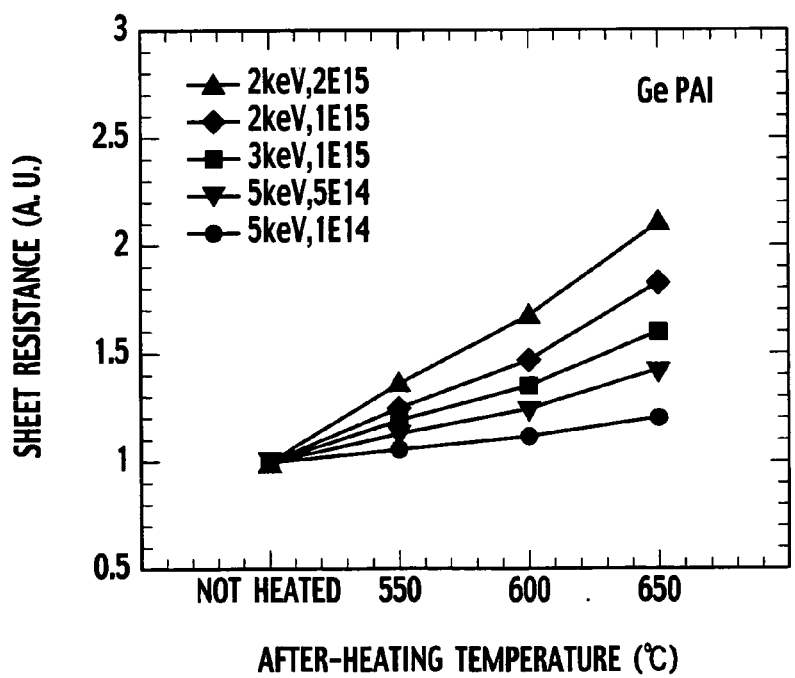
FIG. 23B is a diagram showing increment ratios of sheet resistances dependent on the Ge ion implantation conditions.

In FIGS. 23A and 23B, shown are similar data from samples obtained by implanting B$^+$ at the acceleration energy of 0.7 keV, by a dose of $1 \times 10^{15}$/cm$^2$, and further implanting germanium ions.

(Examination of Junction Depth)

Figure 24:
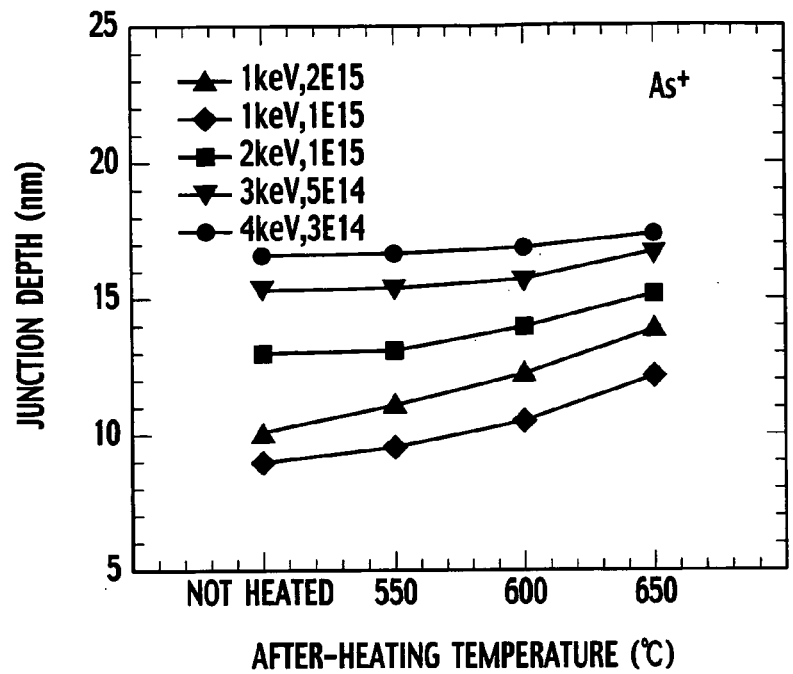
FIG. 24 is a diagram showing pn junction depths of a semiconductor substrate implanted with arsenic ions immediately after activation as well as after furnace annealing in the after-heating step.
Figure 25:
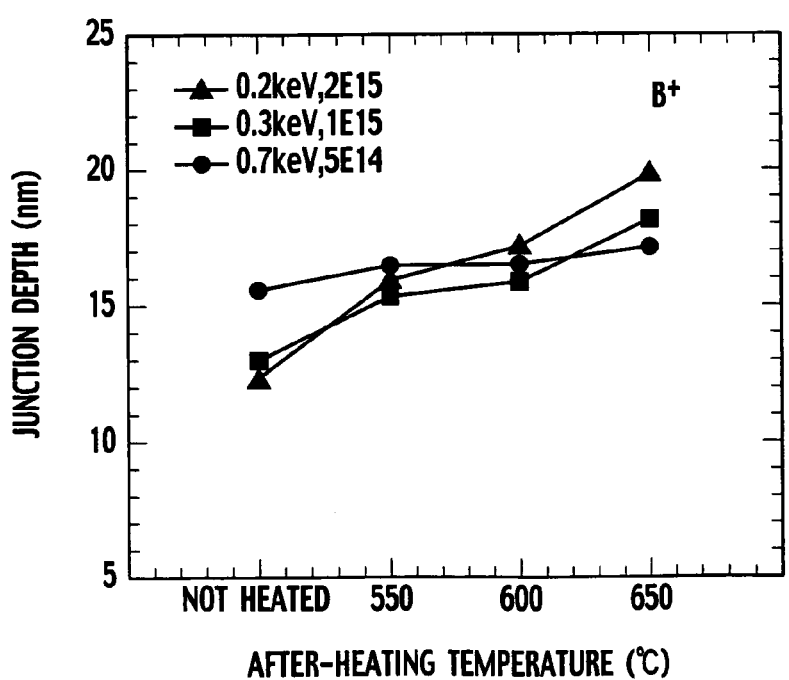
FIG. 25 is a diagram showing pn junction depths of a semiconductor substrate implanted with boron ions immediately after activation as well as after furnace annealing in the after-heating step.

Further, impurity profiles of the extension regions 7, 8 formed in Samples 1–10 were measured by a secondary ion mass spectroscopy (SIMS). FIG. 24 and FIG. 25 are the graphs showing the results arranged for data of the junction depth. Taking the abscissa as the temperature of the after-hating step, plotted are the data of the junction depth in each sample, which was not through after-hating step, immediately after the first anneal and the data of the junction depth after the after-hating step performed at each temperature. Moreover, determination of the junction depth of each sample was performed on the basis of a depth at which density of the impurity ions is equal to $5 \times 10^{18}$/cm$^3$ by examining the profiles of impurity distribution of according to SIMS data for each sample.

From FIG. 24 and FIG. 25, in order to obtain a equivalently shallow pn junction, it is seen that broadening of the impurity distribution through the after-hating step can be restricted to a lower level if the ion implantation conditions that acceleration energy of the impurity ions is higher and a dose of the impurity ions is smaller are selected. Moreover, on the same ion implantation condition, the higher an after-heating temperature is, the larger is broadening of the impurity distribution through the after-hating step. Further, when an examination was made in a range of the supplementary heating temperatures higher than 300° C. to 350° C., shown was such a tendency that the higher the supplementary heating temperature of the silicon substrate 1 in the anneal, the deeper in the substrate 1 broadened is the impurity distribution after the anneal as well as the larger is the amount of broadening of the impurity distribution through the after-hating step.

(Discussion)

During the activation process of the impurity ions implanted into the silicon substrate 1, the impurity ions are taken into the lattice sites of silicon atoms through solid-state growth process of the silicon crystalline lattices including the impurity ions. In the case above, when the given time is an extremely short period, the impurity distribution in the depth direction after the solid-state growth does not change from and keeps almost the same distribution as that immediately after implanting the impurity ions. This is due to the fact that diffusion velocity of the impurity at the annealing temperature is extremely small compared to the velocity of the solid-state growth.

When the activation process is advanced by RTA using a conventional halogen lamp, for example, annealing is forced to continue after solid-state growth has ceased. Therefore, the implanted impurity ions are redistributed by diffusion due to the concentration distribution in the grown crystal, and the formation of a shallow impurity diffused layer with low electrical resistance turns difficult. When the activation process is advanced using flash lamp light, on the other hand, the anneal at a high temperature and for an extremely short period is available. Therefore, the impurity ions beyond the solid-solubility limit at thermal equilibrium can be added while the impurity diffusion is restrained.

However, only the anneal at a high temperature and for an extremely short period using flash lamp light is not sufficient to form an activated region with a shallow impurity layer of approximately a few tens of nanometers in the silicon substrate 1. Indeed, damage such as slips, pattern defects, fractures have been conventionally liable to occur in the silicon substrate 1 after the anneal was finished resulting in a low production yield. In other ward, since so-called "process window" is so small that it has been difficult to form a well-activated impurity implanted region while avoiding the damage.

The anneal for an extremely short period can promote the advance of activation without substantial diffusion of the impurity ions, and is surely an advantageous method of activation treatment from this viewpoint. However, as the results of observation with an electron microscope also will show in the following, perfect activation of the impurity ions and perfect recovery of defects due to the ion implantation turns difficult because of an extremely short-period treatment. After the anneal, the impurity ions that have not been sufficiently activated and the implantation defects that have not been sufficiently recovered are liable to remain in the impurity implanted region.

Within the examined range, the more the amount of the impurity ions becomes, the less turns the activated concentration in the impurity region. This point is the same as already shown using the sheet resistance as an index. The present inventors consider that this decrease in the activated concentration is because the remaining impurity ions which have not been sufficiently activated and the remaining implantation defects which have not been sufficiently recovered increase within the ion implanted region, and these increased inactive impurity ions and ion implantation defects block the recovery of the other defects, when the impurity ions has been implanted into the silicon substrate 1 at a density higher than the given value. It is also considered that the remaining inactive impurity ions and ion implantation defects give rise to re-diffusion and redistribution of the impurity ions during after-heating step, and they further encourage inactivation (increase in sheet resistance) and diffusion of the impurities (deepening of the junction depth).

Even if the treatment time is maintained at the extremely short period above, it will be to some extent capable to decrease inactive impurity ions and implantation defects by means of raising the energy of the heating means such as flash lamp light and the supplementary heating temperature with the supplementary heating means concerned. On the other side, however, the amount of thermal stress, which must be borne by the silicon substrate 1, also increases to make various damage occur resulting in difficulty in constituting a practical method of manufacturing semiconductors at a high yield.

Figure 26A:
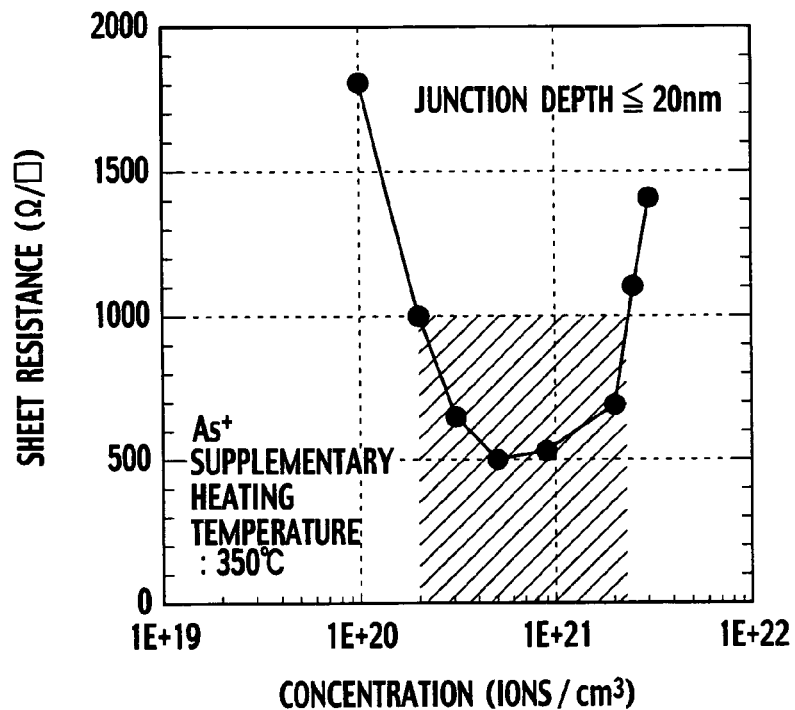
FIGS. 26A and 26B are diagrams showing the relation between concentrations of the impurity ions implanted to form shallow extension regions of 20 nm or less and values of the sheet resistances of the extension regions formed by the following anneal.
Figure 26B:
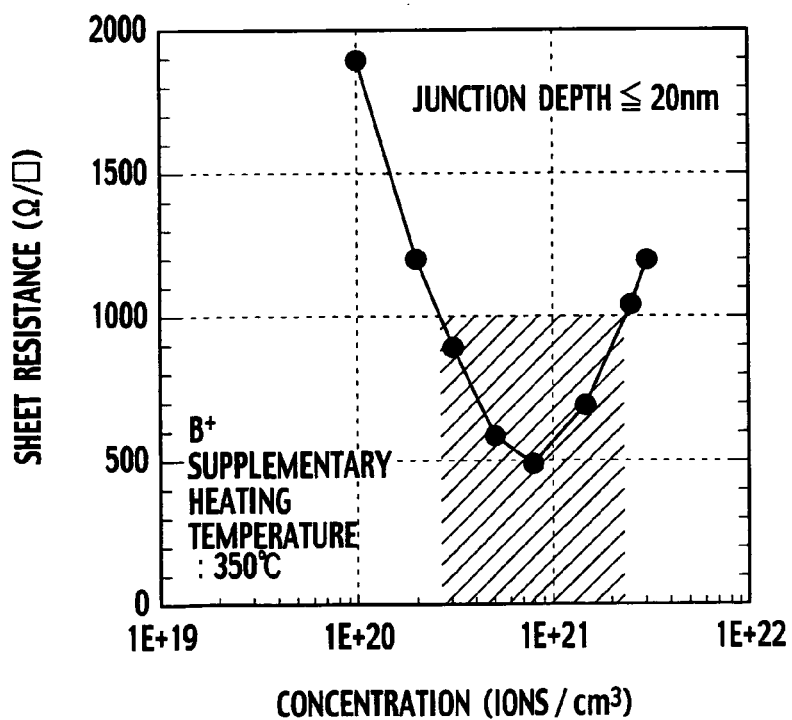

FIG. 26 is the graph showing the rearranged results for the influence of the implanted concentration on the activated concentration of the impurities taking the abscissa as not the dose of ion implantation but the number of the impurity ions per unit volume (implanted concentration of the impurity ions, ions/cm$^3$) in the silicon substrate 1 after the ion implantation, taking the ordinate as the sheet resistance after the anneal at a high temperature for a short period. It is seen that the sheet resistances suddenly increase around where the impurity ions exceed approximately $2\times10^{21}$ ions/cm$^3$. Consequently, it is presumed that the inactive excess impurity ions and the implantation defects increase drastically around this level of the concentration of the impurity ions.

According to the fourth embodiment, a sequence of process steps for manufacturing a semiconductor device comprises an ion implantation under the condition that the implanted concentration does not exceed $2\times10^{21}$/cm$^3$ at most; a subsequent annealing for a extremely short period; and further an after-heating process represented by, for example, formation of a sidewall spacer, formation of a silicide electrode using Cobalt and Nickel etc., and formation of an interlayer insulation film. The temperature of the silicon substrate during such an after-heating process is typically from 500° C. to 700° C. Therefore, the remaining of both the inactive impurity ions and ion implantation defects, which is not yet sufficiently recovered, is suppressed, and the restraint to recovery of the defects is avoided. Consequently, the anneal for an extremely short period is performed supplying the minimum energy, and the impurity ions can be effectively activated while the diffusion of the implanted impurity ions is restrained. Since the remaining of both the impurity ions that have not been activated and the ion implantation defects that have not been recovered is suppressed, additional performance of the after-heating step after the anneal does not cause any substantial troubles.

In a fourth embodiment, the first anneal and the second anneal are performed at a supplementary heating temperature of 500° C. or less. Apparently, it may be assumed that thermal energy which is received by the silicon substrate 1 had better be larger under the same amount of irradiation energy of the flash lamp light, if the supplementary heating temperature is set higher. However, under a temperature range higher than the given temperature, not only the advance of impurity diffusion can be restrained but the advance of solid-state growth of an amorphous layer formed by ion implantation can be also restrained when the supplementary heating temperature is set lower, and the flash lamp light can be taken in maintaining the amorphous layer.

The amorphous layer has a lower melting point and a higher light absorbance within a region of the wavelength of the flash lamp light compared with an ordinary silicon substrate. Thus, the heating efficiency of the flash lamp light themselves can be greatly enhanced. Namely, even under the same amount of irradiation energy, more effective annealing effect can be obtained by irradiating the flash lamp light at a state where the amorphous layer is maintained by keeping the supplementary heating temperature lower compared to setting the supplementary heating temperature higher.

In the fourth embodiment, the remaining of both the impurity ions which have not been sufficiently activated even by the anneal and the implantation defects which have not been sufficiently recovered is avoided by restraining the amount of the implanted impurity ions per unit volume. Consequently, it is not substantially required for this purpose to enlarge the irradiation energy of the pulsed light in anneal and to set the supplementary heating temperature high. Therefore, in a fourth embodiment, the irradiation energy and the supplementary heating temperature in the anneal can be determined more freely, and the effect of the high light absorbance of the amorphous silicon material can be effectively utilized at a low supplementary heating temperature.

Further, through additional performance of implanting the ions of the nonconductive atom, which has a large mass number and is easy to replace a silicon atom, such as germanium ions, it is promoted to make the ion implanted region amorphous and activation of the impurity ions can be effectively performed by the anneal at low energy level. However, too much implantation of the nonconductive ions has the opposite effect. For example, in the typical combination of $B^+$ and $Ge^+$, the preferable range of the $Ge^+$ concentration is $5 \times 10^{19}$ ions/cm$^3$ to $5 \times 10^{20}$ ions/cm$^3$. The amount beyond this range makes recovery of the defects insufficient instead, and causes insufficient activation and re-diffusion in the after-heating step. When the amount is below this range, it is difficult for the crystals to turn amorphous sufficiently, and the substantial effect of $Ge^+$ implantation cannot be obtained.

Moreover, by setting the supplementary heating temperature at a low level, resistance to thermal stress generated through the extremely short period annealing is enhanced since strength of the substrate can be maintained, leading to ensuring a stable process. However, there is a limit to making the temperature lower, and it is of no practical use to lower the supplementary heating temperature than 200° C. because the load of a hardware, such as a lamp, capacitor breakdown voltage, is increased due to the requirement for the excess light energy to activate the impurity.

Figure 27A:
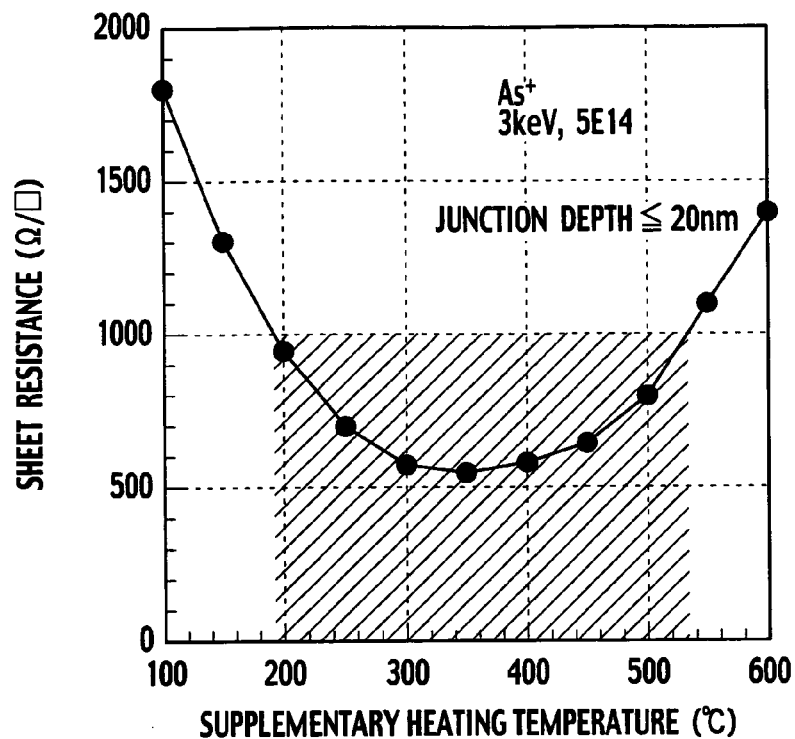
FIGS. 27A and 27B are diagrams showing sheet resistances of the shallow extension regions of 20 nm or less formed by performing anneal at a supplementary heating temperature varying from 100° C. to 600° C.
Figure 27B:
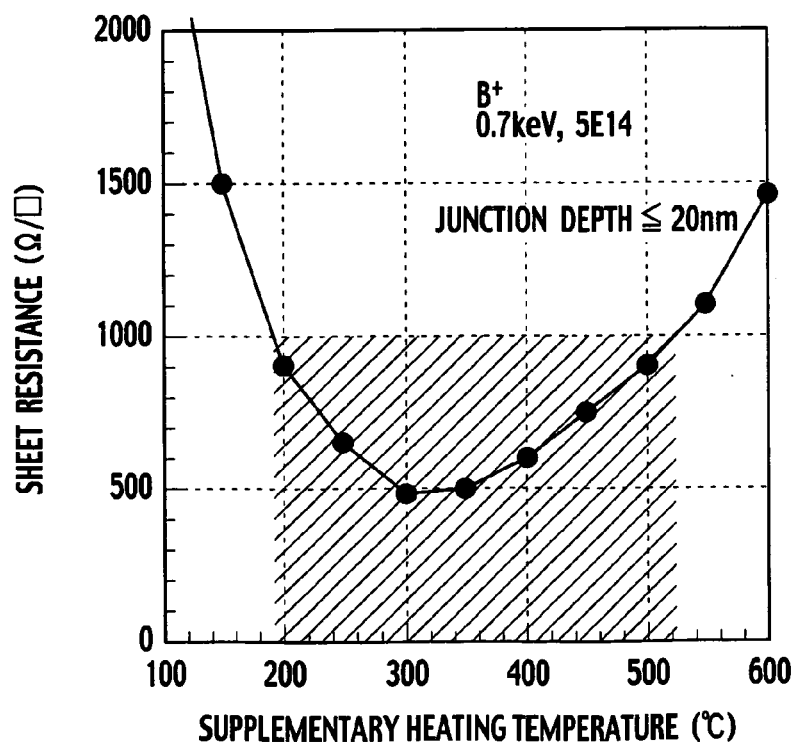

FIG. 27 are diagrams showing the measured results of sheet resistances of the extension regions 7 and 8, wherein the shallow extension regions 7, 8 of 20 nm or less are formed by carrying out the first anneal at different supplementary heating temperatures between 100° C. and 600° C. on Sample 4 and Sample 10. As noted already, ion implantations were conducted on these two samples with preferable condition ranges characterized by high energies and small doses: 3 keV $As^+$ to a dose of $5 \times 10^{14}$/cm$^2$ and 0.7 keV $B^+$ to a dose of $5 \times 10^{14}$/cm$^2$, respectively. It is seen that when the supplementary heating temperature is within a range of 200° C. to 500° C., the extension regions 7, 8 with ten thousand ohms/sq or less can be obtained.

So far, data have been studied and discussed focusing on the formation of the shallow extension regions 7, 8. However, the objects to which these examination and discussion can be applied should not be limited to the formation of the shallow extension regions 7, 8. Although the particular conditions such as the preferable ion implantation condition may be different from one another, the way of thinking is identical and can be competent for the formation of another activated impurity regions including a deep source-drain region. The manufacturing method of a fourth embodiment has a significant effect on the formation of an impurity region particularly with low electrical resistance and precise formation accuracy.

A manufacturing method of a semiconductor device of a fourth embodiment was performed according to the conditions employed for the samples 4 and 10, which have been regarded as preferable, to form the extension regions 7, 8 and was designated as Example 6. A sequence of manufacturing steps of a semiconductor device shown as a fourth embodiment was performed according to the conditions of forming the extension regions 7, 8 in the samples 1 and 6, which have employed the undesirable conditions among the ion implantation conditions listed in Table 1, and was designated as Comparative Example 4 shown concretely in the following.

EXAMPLE 6

Ionizing arsenic (As), the ions were implanted into a surface of a p-well layer 2 on the implantation conditions: acceleration energy 3 keV; a dose $5 \times 10^{14}$ cm$^{-2}$. Further, ionizing germanium (Ge), the ions were implanted into a surface of an n-well layer 3 on the implantation conditions: acceleration energy 5 keV; a dose $1 \times 10^{14}$ cm$^{-2}$, and then ionizing boron (B), the ions were implanted into a surface of an n-well layer 3 on the implantation conditions: acceleration energy 0.7 keV; a dose $5 \times 10^{14}$ cm$^{-2}$.

Next, each of the implanted impurity ions was activated by irradiating flash lamp light on the conditions: a supplementary heating temperature of a silicon substrate 1 350° C.; irradiation energy 50 J/cm$^2$; a half-width of the pulse 3 milliseconds; a time to reach the pulse peak 1 millisecond. As mentioned above, extension regions 7, 8 with the thickness of 20 nm or less of n-type and p-type, respectively were formed in the p-well layer. 2 and the n-well layer 3.

Then, ionizing phosphor (P), the ions were implanted into the surface of the p-well layer 2 on the implantation conditions: acceleration energy 10 keV; a dose $3 \times 10^{15}$ cm$^{-2}$. Further, ionizing germanium (Ge), the ions were implanted into a surface of an n-well layer 3 on the implantation conditions: acceleration energy 5 keV; a dose $1 \times 10^{14}$ cm$^{-2}$, and then ionizing boron, the ions were implanted into the n-well layer 3 on the implantation conditions: acceleration energy 4 keV; a dose $3 \times 10^{15}$ cm$^{-2}$.

Next, the implanted impurity ions were activated by irradiating flash lamp light on the conditions: a supplementary heating temperature of a silicon substrate 1 350° C.; irradiation energy 50 J/cm$^2$; a half-width of the pulse 3 milliseconds; a time to reach the pulse peak 1 millisecond.

As mentioned above, formed were deep source-drain regions 11, 12 apart from a gate electrode 6 and adjacent to the previously formed shallow extension regions 7, 8.

It was confirmed from the sheet resistances of the impurity ion implanted surfaces of the silicon substrate 1 that activation of the implanted impurity ions was sufficiently advanced. The results are as shown in FIG. 21 to FIG. 22, the electrical resistances were sufficiently low, and the planar variance a of the sheet resistances taken from a plurality of elements for sheet resistance measurement formed on the silicon substrate 1 was suppressed less than 1%.

COMPARATIVE EXAMPLE 4

Ionizing arsenic (As), the ions were implanted into a surface of a p-well layer 2 on the implantation conditions: acceleration energy 1 keV; a dose $2 \times 10^{15}$ cm$^{-2}$ Further, ionizing germanium (Ge), the ions were implanted into a surface of an n-well layer 3 on the implantation conditions: acceleration energy 2 keV; a dose $2 \times 10^{15}$ cm$^{-2}$, and then ionizing boron (B), the ions were implanted into a surface of an n-well layer 3 on the implantation conditions: acceleration energy 0.2 keV; a dose $2 \times 10^{15}$ cm$^{-2}$.

Next, each of the implanted impurity ions was activated by irradiating flash lamp light on the conditions: a supplementary heating temperature of a silicon substrate 1 350° C.; irradiation energy 50 J/cm$^2$; a half-width of the pulse 3 milliseconds; a time to reach the pulse peak 1 millisecond. As mentioned above, extension regions 7, 8 with the thickness of 20 nm or less of n-type and p-type, respectively were formed in the p-well layer 2 and the n-well layer 3.

Then, by the same steps as those in Example 6, formed were deep source-drain regions 11, 12 apart from a gate electrode 6 and adjacent to the previously formed shallow extension regions 7, 8.

COMPARATIVE EXAMPLE 5

A semiconductor device was manufactured through the same steps as those in Example 6, except setting the supplementary heating temperature of the silicon substrate 1 at 650° C. during the formation of shallow extension regions 7, 8 and deep source-drain regions 11, 12.

(Defects)

The occurrence of defects was confirmed about the semiconductor devices manufactured in Example 6 and Comparative Example 4, 5. A transmission electron microscope (TEM) was used for confirmation of the defects, and the existence of crystalline defects and dislocations after the first anneal and after the second anneal was focused.

As a result, it was seen that crystalline defects, dislocations, etc. were never observed at all in the samples of Example 6, but that recovery of the defects in the impurity ion implanted region was not sufficient resulting in the remaining of the defects probably induced by the ion implantation in the samples in Comparative Example 4 and Comparative Example 5. Particularly, the density of EOR (end of range) defects specifically in the extension region within the p-well layer 2 after performing the first anneal was $2 \times 10^{12}$ defects/cm$^2$ for Comparative Example 4 and $5 \times 10^{11}$ defects/cm$^2$ for Comparative Example 5 on the plane which is parallel to the surface of the silicon substrate 1 and lies at the depth of 10 to 15 nm in the silicon substrate 1.

Figure 28:
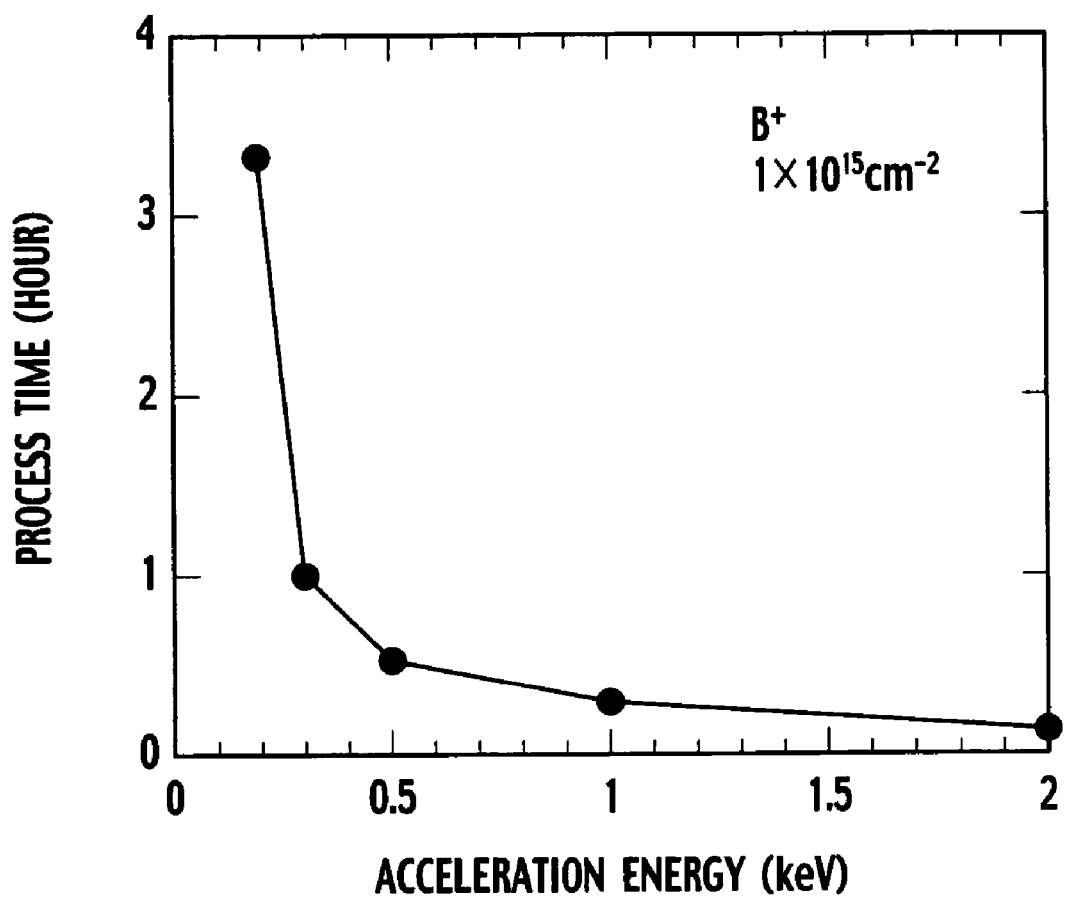
FIG. 28 is a diagram showing a relation between acceleration energy of implanted ions and process time.

The manufacturing method of a semiconductor device of a fourth embodiment forms the activated impurity region setting the acceleration energy larger and the dose of ion implantation smaller. Therefore, the method is greatly effective in reducing the material cost and the process time necessary for the manufacture of the semiconductor device. FIG. 28 is a diagram showing an example of a relation between acceleration energy and a time required for ion implantation process taking the case, where boron ions are implanted by a dose of $1 \times 10^{15}$ cm$^{-2}$, as an example. It is recognized that the process time required can be sufficiently restrained by setting the acceleration energy 0.3 keV or more when boron ions are implanted by a dose of $1 \times 10^{15}$ cm$^{-2}$. In the method of a fourth embodiment, when the equivalent depth of the pn junction is expected, the ion implantation will be performed at higher acceleration energy and by a less dose than the conventional amounts, and these features of the manufacturing method are also effective in enhancing the productivity.

Figure 29A:
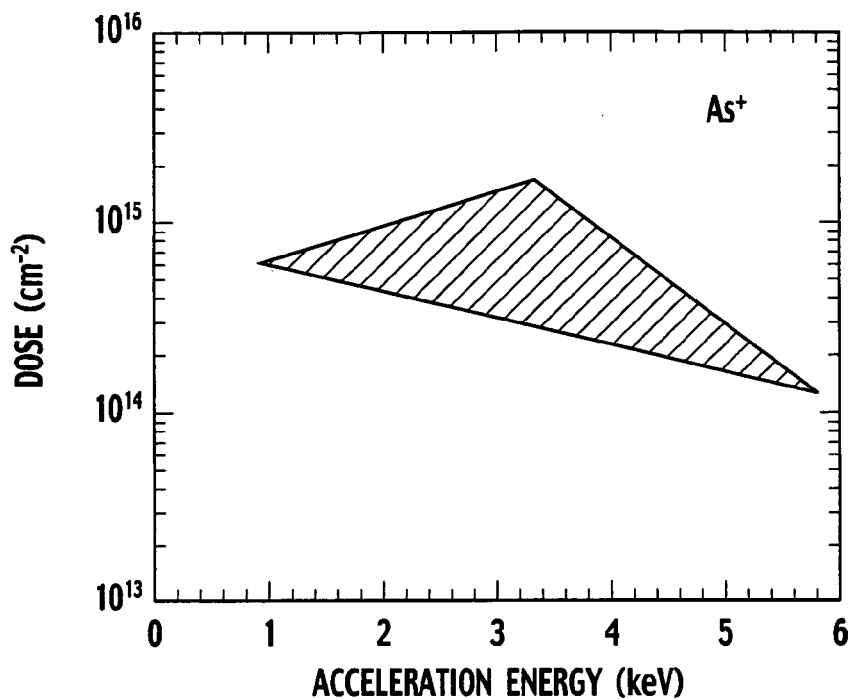
FIGS. 29A and 29B are diagrams showing an allowable range for acceleration energy and doses of impurity ions when extension regions are formed according to the fourth embodiment.
Figure 29B:
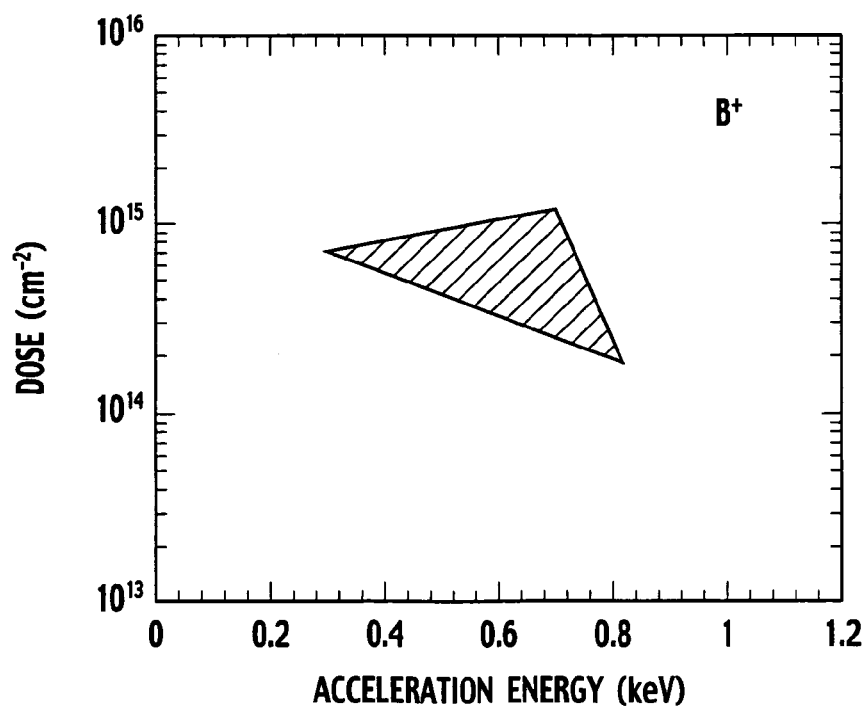

FIGS. 29A and 29B are diagrams showing a process window (hatched region) of the first ion implantation step through which the results with the pn junction depth of 20 nm or less and the sheet resistance of 1 kΩ/sq are obtained via a sequence of transistor forming steps including an after-heating step following the first anneal. FIG. 29A is of the case where As$^+$ is implanted and FIG. 29B is of the case where B$^+$ is implanted, and the first anneal was performed, for example, by irradiating xenon flash lamp light onto the silicon substrate 1 supplementary heated at 350° C. on the conditions: a pulse width 3 milliseconds; irradiation energy 50 J/cm$^2$. Besides, the after-heating step is a step of keeping a temperature of 600° C. for 180 minutes.

As seen from the example shown in FIG. 29A and FIG. 29B, the process window, through which an activated impurity region miniaturized to a few tens nm is formed, has a relatively large area according to the manufacturing method of a fourth embodiment. Therefore, the method of a fourth embodiment is expected not to cause any troubles even when it will be provided for mass-production as a technology at its practical stage.

As described above, according to a fourth embodiment, the shallow impurity region with low electrical resistance can be formed without generating any damage due to thermal stress in the silicon substrate 1 by controlling both the concentration of the impurities implanted into the silicon substrate 1 and the supplementary heating temperature during annealing. Moreover, the implantation defects causing insufficient activation and leakage current can be sufficiently recovered.

(Other Embodiments)

As described above, first to fourth embodiments of the present invention have been described. However, the present invention should not be limited to these embodiments but can be modified variously within the scope of the equivalents.

For example, it is possible to combine the first embodiment wherein the implanted impurity ions are activated by irradiating the pulsed light with the rise time larger than the given value together with the fourth embodiment wherein the impurity ions are activated by restraining the concentration of the implanted impurity ions to the given value or less.

Further, throughout Examples, an annealing device with a xenon flash lamp as a light source of irradiating light was used for explanation. However, the present invention should not be limited to that, but a pulsed light source such as a laser, with which high intensity emission and extremely short period annealing can be achieved, may be used. Concretely as a light source except a Xe lamp, an excimer laselightAG laser, a metal halide lamp, a Kr lamp, a mercury lamp, and a hydrogen lamp can be utilized. An irradiation time is preferably 100 milliseconds or less, more preferably 1 millisecond or more and 10 milliseconds or less, most preferably 3 milliseconds or more and 10 milliseconds or less.

Moreover, a MOS transistor was taken as an example of a semiconductor in each embodiment however, the semiconductor of present invention should not be limited to that, and another insulation gate transistor (MIS), etc. where a silicon oxide film is not used as a gate insulation film can be employed. Other modifications can also be used without exceeding the gist of the present invention.

What is claimed is:

1. A method for manufacturing a semiconductor device, comprising:
    implanting impurity ions into a silicon layer at a concentration not more than $2 \times 10^{21}$ ions/cm$^3$, so as to form a shallow extension region of 20 nm or less; and
    irradiating a pulsed light having a pulse width of 100 milliseconds or less, and a rise time of 0.3 milliseconds or more onto the silicon layer thereby activating the impurity ions, so as to prevent increasing thermal stress generated in the silicon substrate, the rise time being defined as a time interval of a leading edge between an instant at which the pulsed light starts to rise and an instant at which the pulsed light reaches a peak energy.

2. The method of claim 1, where the silicon layer is heated at a temperature between 300° C. and 600° C. when the pulsed light is irradiated.

3. The method of claim 1, wherein the pulse width is equal to or larger than one millisecond.

4. The method of claim 1, wherein the impurity ions have a different conductivity type from the silicon layer, so as to form source-drain regions in the silicon layer.

5. The method of claim 1, wherein the silicon layer is heated at a temperature between 200° C. and 500° C. when the pulsed light is irradiated.

6. The method of claim 1, further comprising:
carrying out a process while keeping the silicon layer within the temperature range of 500° C. to 700° C. after irradiating the pulsed light.

7. The method of claim 6, wherein the process is selected from the group consisting of:
forming a gate electrode sidewall spacer comprising a silicon nitride film;
forming a silicide electrode;
forming an interlayer insulation;
and combinations thereof.

8. The method of claim 1, wherein the impurity ions have a different conductivity type from the silicon layer, so as to form source-drain extension regions having a depth of 20 nm or less in the silicon layer.

9. The method of claim 1, wherein the pulsed light is emitted from a xenon flash lamp.

10. The method of claim 1, further comprising:
implanting germanium ions into the silicon layer before irradiating the pulsed light.

11. A method for manufacturing a semiconductor device, comprising:
delineating a gate electrode on a silicon substrate;
depositing a silicon nitride film on the gate electrode at a temperature of 600° C. or less;
implanting impurity ions into the silicon nitride film;
irradiating a pulsed light having a pulse width of one millisecond to 100 milliseconds onto the silicon nitride film; and
anisotropically etching the silicon nitride film after the irradiation so as to leave a part of the silicon nitride film on sidewalls of the gate electrode.

12. The method of claim 11, wherein the silicon nitride film is deposited by LPCVD using hexachlorodisilane ($Si_2Cl_6$).

13. The method of claim 11, wherein the silicon nitride film is heated at a temperature between 300° C. and 600° C. when the pulsed light is irradiated.

14. The method of claim 11, wherein the pulsed light is emitted from a xenon flash lamp.

15. The method of claim 11, further comprising:
forming source-drain extension regions having a depth of 15 nm or less in the silicon substrate before depositing the silicon nitride film.

16. The method of claim 11,
wherein implanting the impurity ions into the silicon nitride film comprises implanting impurity ions into the silicon substrate through the silicon nitride film thereby forming source-drain regions.

17. A method for manufacturing a semiconductor device, comprising:
delineating a gate electrode on a silicon substrate;
forming a silicon oxide film on the gate electrode;
depositing a silicon nitride film on the silicon oxide film at a temperature of 600□ or lower;
irradiating a pulsed light having a pulse width of one millisecond to 100 milliseconds onto the silicon nitride film; and,
anisotropically etching the silicon nitride film so as to leave a part of the silicon nitride film on sidewalls of the gate electrode before or after the irradiation;
removing the silicon oxide film with hydrofluoric acid so as to leave a part of the silicon oxide film on the sidewalls; and
implanting impurity ions into the silicon substrate using the part of the silicon nitride film and the part of the silicon oxide film as masks.

* * * * *